United States Patent
Ueda et al.

(10) Patent No.: US 9,502,133 B2
(45) Date of Patent: Nov. 22, 2016

(54) SEMICONDUCTOR DEVICE

(71) Applicant: Sharp Kabushiki Kaisha, Osaka-shi, Osaka (JP)

(72) Inventors: Naoki Ueda, Osaka (JP); Sumio Katoh, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 15/028,240

(22) PCT Filed: Sep. 2, 2014

(86) PCT No.: PCT/JP2014/073009
§ 371 (c)(1),
(2) Date: Apr. 8, 2016

(87) PCT Pub. No.: WO2015/053009
PCT Pub. Date: Apr. 16, 2015

(65) Prior Publication Data
US 2016/0247579 A1 Aug. 25, 2016

(30) Foreign Application Priority Data

Oct. 11, 2013 (JP) .................. 2013-213935

(51) Int. Cl.
*G11C 13/00* (2006.01)
*G11C 17/16* (2006.01)
(Continued)

(52) U.S. Cl.
CPC .............. *G11C 17/16* (2013.01); *G11C 17/18* (2013.01); *H01L 27/11206* (2013.01);
(Continued)

(58) Field of Classification Search
CPC .......... G11C 13/0004; G11C 13/0011; G11C 2213/79
USPC .......................................... 365/94, 100, 148
See application file for complete search history.

(56) References Cited

U.S. PATENT DOCUMENTS

2009/0179302 A1 7/2009 Kothandaraman et al.
2010/0002611 A1 1/2010 Umatt et al.
(Continued)

FOREIGN PATENT DOCUMENTS

JP 2008-277809 A 11/2008
JP 2010-211839 A 9/2010
(Continued)

OTHER PUBLICATIONS

Official Communication issued in International Patent Application No. PCT/JP2014/073009, mailed on Oct. 14, 2014.
(Continued)

*Primary Examiner* — Jason Lappas
(74) *Attorney, Agent, or Firm* — Keating & Bennett, LLP

(57) ABSTRACT

A memory cell (101) includes a memory transistor (10A) having channel length L1 and channel width W1, and a plurality of select transistors (10B) each electrically being connected in series with the memory transistor and independently having channel length L2 and channel width W2, wherein each of the memory transistor and the plurality of select transistors includes an active layer (7A) formed from a common oxide semiconductor film, the memory transistor is a transistor which is capable of being irreversibly changed from a semiconductor state where drain current Ids depends on gate voltage Vg to a resistor state where drain current Ids does not depend on gate voltage Vg, and channel length L2 is greater than channel length L1.

20 Claims, 22 Drawing Sheets

(51) Int. Cl.
    *G11C 17/18*     (2006.01)
    *H01L 29/10*     (2006.01)
    *H01L 29/24*     (2006.01)
    *H01L 29/786*     (2006.01)
    *H01L 29/423*     (2006.01)
    *H01L 27/112*     (2006.01)

(52) U.S. Cl.
    CPC .......... *H01L 29/1033* (2013.01); *H01L 29/24* (2013.01); *H01L 29/42356* (2013.01); *H01L 29/7869* (2013.01); *G11C 13/0004* (2013.01); *G11C 13/0011* (2013.01); *G11C 2213/79* (2013.01)

(56) References Cited

U.S. PATENT DOCUMENTS

| | | |
|---|---|---|
| 2010/0226193 A1 | 9/2010 | Yamauchi et al. |
| 2011/0128777 A1* | 6/2011 | Yamazaki ............ G11C 11/405 365/149 |
| 2012/0138922 A1 | 6/2012 | Yamazaki et al. |
| 2012/0162700 A1 | 6/2012 | Miyazaki |
| 2012/0212991 A1 | 8/2012 | Kanematsu et al. |
| 2013/0161609 A1 | 6/2013 | Koyama |
| 2014/0334227 A1 | 11/2014 | Ueda |
| 2015/0206977 A1 | 7/2015 | Katoh et al. |
| 2015/0243668 A1 | 8/2015 | Ueda et al. |

FOREIGN PATENT DOCUMENTS

| | | |
|---|---|---|
| JP | 2010-262711 A | 11/2010 |
| JP | 2012-134475 A | 7/2012 |
| JP | 2012-137868 A | 7/2012 |
| JP | 2012-174864 A | 9/2012 |
| JP | 2012-231480 A | 11/2012 |
| JP | 2013-149961 A | 8/2013 |
| WO | 2013/080784 A1 | 6/2013 |

OTHER PUBLICATIONS

Safran et al., "A Compact eFUSE Programmable Array Memory for SOI CMOS", 2007 Symposium on VLSI Circuits Digest of Technical Papers, 2007, pp. 72-73.

* cited by examiner (a)

(b)

(c)

(d)

(a)

(b)

(a)

(b)

(a)

(b)

(a)

(b)

(a)

(b)

(c)

(a)

(b)

(a)

(b)

(a)

(b)

SEMICONDUCTOR DEVICE

TECHNICAL FIELD

The present invention relates to a semiconductor device and particularly to a semiconductor device which includes a memory transistor and a select transistor.

BACKGROUND ART

Using an element which has a transistor structure as a memory element which can be used as a ROM (Read Only Memory) has been conventionally proposed.

For example, Patent Document 1 discloses an eFuse (Electronic Fuse) in which two terminals, a cathode and an anode, are provided in a multilayer structure of polysilicon/silicide/silicon nitride film, which has the same wire structure as that used in common logic LSI processes. By allowing a large electric current to flow through this eFuse, the eFuse is heated, and the resistance value between the two terminals varies. Although Patent Document 1 fails to disclose the technique of using the eFuse as a memory cell, Patent Document 1 discloses a configuration where two transistors (select transistors) and an eFuse are connected in series such that a large electric current flows.

Patent Document 2 discloses an electrically-programmable fuse element. Patent Document 2 discloses a configuration where this fuse element and two MOS transistors (select transistors) are connected in series for operations of programming (writing) and reading.

On the other hand, Patent Document 3 of the present applicant proposes a novel memory transistor which is capable of reducing the power consumption as compared with conventional memory transistors. This memory transistor uses a metal oxide semiconductor in the active layer (channel). This memory transistor can irreversibly change to a resistor state which exhibits an ohmic characteristic due to Joule heat produced by the drain current, irrespective of the gate voltage. Using such a memory transistor enables to make a voltage for writing lower than the voltages in Patent Documents 1 and 2, and hence, the power consumption can be reduced.

Patent Document 3 also discloses a memory cell consisting of one memory transistor and one select transistor. Patent Document 3 also discloses forming a memory transistor in an active matrix substrate of a liquid crystal display device, for example.

Note that, in the specification of the present application, the operation of changing a metal oxide semiconductor of this memory transistor to a resistor state is referred to as "writing operation". In this memory transistor, the metal oxide semiconductor is a resistor after writing, and therefore, the memory transistor does not work as a transistor. However, in this specification, it is referred to as "memory transistor" even after transition to the resistor. Likewise, even after transition to the resistor, terms such as gate electrode, source electrode, drain electrode, channel electrode, etc., which are constituents of a transistor structure are used.

CITATION LIST

Patent Literature

Patent Document 1: Specification of U.S. Patent Application No. 2009/0179302
Patent Document 2: Japanese Laid-Open Patent Publication No. 2010-211839
Patent Document 3: WO 2013/080784

SUMMARY OF INVENTION

Technical Problem

In a semiconductor device such as an active matrix substrate which includes a memory transistor, further increasing the writing speed of the memory transistor has been demanded.

The present inventors conducted research and got the following knowledge.

In Patent Documents 1 and 2, during writing, the fuse element is connected in series with the two select transistors, and therefore, the power is consumed also in these select transistors so that a sufficient electric power does not occur in the fuse element. As a result, the writing speed in the fuse element decreases. Particularly, as the number of select transistors connected in series increases, deterioration of the select transistors due to the writing operation affects, and it is difficult to increase the writing speed.

In Patent Documents 1 and 2, a select transistor used during writing is present in a current path used for reading, and therefore, the characteristics of the select transistor deteriorate due to the electric current flowing in a writing operation, so that the current-voltage characteristic can vary. Thus, in a reading operation, a read current from the fuse element decreases so that the output voltage to a sense amplifier becomes unstable, and there is a probability that the reading operation margin decreases.

In the memory transistor of Patent Document 3, the writing speed can be increased by setting a voltage which is applied between the drain and the source of the memory transistor in the case of writing (writing voltage) to a large value. However, in the case of writing in the memory transistor, there is a probability that the characteristics of the select transistor which is present in a current path for writing vary. This can be a cause of decrease in reliability of a semiconductor device.

An object of an embodiment of the present invention is to increase the writing speed of a memory transistor while securing the reliability of a semiconductor device.

Solution to Problem

A semiconductor device of an embodiment of the present invention includes at least one memory cell. The at least one memory cell includes a memory transistor having a first channel length L1 and a first channel width W1, and a plurality of select transistors each electrically being connected in series with the memory transistor and independently having a second channel length L2 and a second channel width W2, wherein each of the memory transistor and the plurality of select transistors includes an active layer formed from a common oxide semiconductor film, the memory transistor is a transistor which is capable of being irreversibly changed from a semiconductor state where a drain current Ids depends on a gate voltage Vg to a resistor state where the drain current Ids does not depend on the gate voltage Vg, and the second channel length L2 is greater than the first channel length L1.

In one embodiment, the plurality of select transistors are electrically connected in parallel with each other and share an identical gate control line.

In one embodiment, the second channel width W2 is smaller than the first channel width W1.

In one embodiment, a ratio W2/L2 of the second channel width W2 to the second channel length L2 in the plurality of select transistorsis is smaller than a ratio W1/L1 of the first channel width W1 to the first channel length L1 in the memory transistor.

In one embodiment, a sum of the second channel widths W2 of the plurality of select transistors is greater than the first channel width W1 of the memory transistor.

In one embodiment, the memory transistor is supported by a substrate, the memory transistor includes a gate electrode, a gate insulating film covering the gate electrode, the active layer provided on the gate insulating film, a source electrode provided on the active layer so as to be in contact with a part of the active layer, and a drain electrode provided on the active layer so as to be in contact with another part of the active layer, and when viewed in a direction normal to the substrate, a portion of the active layer which extends over the gate electrode with the gate insulating film interposed therebetween and which is located between the source electrode and the drain electrode has a U-shape.

In one embodiment, the oxide semiconductor film is an In—Ga—Zn—O based semiconductor film.

In one embodiment, the In—Ga—Zn—O based semiconductor film includes a crystalline portion.

In one embodiment, the memory transistor and the plurality of select transistors are thin film transistors.

In one embodiment, the memory transistor is either of a memory transistor S which is in the semiconductor state or a memory transistor R which is in the resistor state.

In one embodiment, the at least one memory cell is a plurality of memory cells, in some of the plurality of memory cells, the memory transistor is the memory transistor S, and in other ones of the plurality of memory cells, the memory transistor is the memory transistor R.

In one embodiment, in the memory transistor S, while an absolute value of a drain-source voltage is in a range of not less than 0.1 V and not more than 10 V, there is a voltage range for the gate-source voltage in which an absolute value of the drain current Ids divided by the channel width W1, Ids/W1, is not more than $1\times10^{14}$ A/μm, and in the memory transistor R, even when the gate-source voltage is set within the voltage range while the absolute value of the drain-source voltage is in a range of not less than 0.1 V and not more than 10 V, the absolute value of the drain current Ids divided by the channel width W1, Ids/W1, varies depending on the drain-source voltage so as to be not less than $1\times10^{-11}$ A/μm.

In one embodiment, the at least one memory cell is a single memory cell and includes the memory transistor S, an internal node is formed by connection of the memory transistor S and the plurality of select transistors, and while the memory transistor S is in an ON state, a low-level voltage VL is output from the internal node when a gate voltage of the plurality of select transistors is a high-level voltage VH, and a high-level voltage VH is output from the internal node when the gate voltage of the plurality of select transistors is a low-level voltage VL.

In one embodiment, the at least one memory cell is a single memory cell and includes either of the memory transistor S or the memory transistor R, an internal node is formed by connection of either of the memory transistor S or the memory transistor R and the plurality of select transistors, when the at least one memory cell includes the memory transistor S, a gate voltage of the memory transistor S is set to a low-level voltage VL that prevents the memory transistor S from transitioning to an ON state, and a gate voltage of the plurality of select transistors is set to a high-level voltage VH, a low-level voltage VL is output from the internal node, and when the at least one memory cell includes the memory transistor R, a gate voltage of the memory transistor R is set to a low-level voltage VL that prevents the memory transistor R from transitioning to an ON state, and a gate voltage of the plurality of select transistors is set to a high-level voltage VH, a high-level voltage VH is output from the internal node.

In one embodiment, the semiconductor device further includes: a word line control circuit for controlling a plurality of first word lines and a plurality of second word lines; a bit line control circuit for controlling a plurality of bit lines; and a sense amplifier circuit for detecting a reading signal from the plurality of memory cells, wherein the plurality of memory cells are arranged in a row direction and a column direction, gate electrodes of the memory transistors included in memory cells arranged in the same row are connected with the word line control circuit via one of the plurality of first word lines corresponding to that row, a gate electrode of each of the plurality of select transistors included in memory cells arranged in the same row is connected with the word line control circuit via one of the plurality of second word lines corresponding to that row, and drain electrodes of the memory transistor included in memory cells arranged in the same column are connected with the bit line control circuit and the sense amplifier circuit via one of the plurality of bit lines corresponding to that column.

In one embodiment, the semiconductor device further includes: a word line control circuit for controlling first and second word lines; a bit line control circuit for controlling a plurality of bit lines; and a sense amplifier circuit for detecting a reading signal from the plurality of memory cells, wherein the plurality of memory cells are arranged in a row direction, gate electrodes of the memory transistors included in the plurality of memory cells are connected with the word line control circuit via the first word line, a gate electrode of each of the plurality of select transistors included in the plurality of memory cells is connected with the word line control circuit via the second word line, and a drain electrode of the memory transistor included in memory cells arranged in each column is connected with the bit line control circuit and the sense amplifier circuit via one of the plurality of bit lines corresponding to that column.

In one embodiment, the semiconductor device further includes: a word line control circuit for controlling a first word line and a plurality of second word lines; a bit line control circuit for controlling a bit line; and a sense amplifier circuit for detecting a reading signal from the plurality of memory cells, wherein the plurality of memory cells are arranged in a column direction, a gate electrode of the memory transistor included in memory cells arranged in each row is connected with the word line control circuit via the first word line, a gate electrode of each of the plurality of select transistors included in memory cells arranged in each row is connected with the word line control circuit via one of the plurality of second word lines corresponding to that row, and drain electrodes of the memory transistors included in the plurality of memory cells are connected with the bit line control circuit and the sense amplifier circuit via the bit line.

In one embodiment, the semiconductor device further includes a sense amplifier circuit for detecting a reading signal from the plurality of memory cells, wherein the plurality of memory cells are arranged in a row direction and/or a column direction, an internal node is formed by connection of the memory transistor and the plurality of select transistors, and the internal node is connected with the sense amplifier circuit.

In one embodiment, a gate-source voltage in each of the plurality of select transistors is not less than a gate-source voltage in the memory transistor.

In one embodiment, a threshold voltage of each of the plurality of select transistors is not less than a threshold voltage of the memory transistor.

In one embodiment, a source electrode of each of the plurality of select transistors is grounded.

In one embodiment, an organic insulating film is not provided above the active layer of the memory transistor.

In one embodiment, a liquid crystal display device includes any of the above-described semiconductor devices.

A semiconductor device of another embodiment of the present invention includes at least one memory cell. The at least one memory cell includes a memory transistor having a first channel length L1 and a first channel width W1, and a plurality of select transistors each electrically being connected in series with the memory transistor and independently having a second channel length L2 and a second channel width W2, wherein each of the memory transistor and the plurality of select transistors includes an active layer formed from a common oxide semiconductor film, the memory transistor is a transistor which is capable of being irreversibly changed from a semiconductor state where a drain current Ids depends on a gate voltage Vg to a resistor state where the drain current Ids does not depend on the gate voltage Vg, and the plurality of select transistors are electrically connected in parallel with each other and share an identical gate control line.

A semiconductor device of still another embodiment of the present invention includes at least one memory cell. The at least one memory cell includes a memory transistor having a first channel length L1 and a first channel width W1, and a plurality of select transistors each electrically being connected in series with the memory transistor and independently having a second channel length L2 and a second channel width W2, wherein each of the memory transistor and the plurality of select transistors includes an active layer formed from a common oxide semiconductor film, the memory transistor is a transistor which is capable of being irreversibly changed from a semiconductor state where a drain current Ids depends on a gate voltage Vg to a resistor state where the drain current Ids does not depend on the gate voltage Vg, and the second channel width W2 is smaller than the first channel width W1.

A semiconductor device of still another embodiment of the present invention includes at least one memory cell. The at least one memory cell includes a memory transistor having a first channel length L1 and a first channel width W1, and a plurality of select transistors each electrically being connected in series with the memory transistor and independently having a second channel length L2 and a second channel width W2, wherein each of the memory transistor and the plurality of select transistors includes an active layer formed from a common oxide semiconductor film, the memory transistor is a transistor which is capable of being irreversibly changed from a semiconductor state where a drain current Ids depends on a gate voltage Vg to a resistor state where the drain current Ids does not depend on the gate voltage Vg, and a ratio W2/L2 of the second channel width W2 to the second channel length L2 in the plurality of select transistors is smaller than a ratio W1/L1 of the first channel width W1 to the first channel length L1 in the memory transistor.

A semiconductor device of still another embodiment of the present invention includes at least one memory cell. The at least one memory cell includes a memory transistor having a first channel length L1 and a first channel width W1, and a plurality of select transistors each electrically being connected in series with the memory transistor and independently having a second channel length L2 and a second channel width W2, wherein each of the memory transistor and the plurality of select transistors includes an active layer formed from a common oxide semiconductor film, the memory transistor is a transistor which is capable of being irreversibly changed from a semiconductor state where a drain current Ids depends on a gate voltage Vg to a resistor state where the drain current Ids does not depend on the gate voltage Vg, and a sum of the second channel widths W2 of the plurality of select transistors is greater than the first channel width W1 of the memory transistor.

Advantageous Effects of Invention

According to an embodiment of the present invention, in a semiconductor device which includes a memory transistor and a plurality of select transistors, it is possible to suppress deterioration of the characteristics of a select transistor which is present in a current path used for writing during writing in the memory transistor while increasing the writing speed of the memory transistor. Therefore, the writing speed of the memory transistor can be increased while the reliability of the semiconductor device is secured.

DESCRIPTION OF EMBODIMENTS

The present inventors repeatedly carried out researches concerning a configuration of a memory cell disclosed in Patent Document 3 including a memory transistor and a select transistor, which is capable of increasing the writing speed of the memory transistor while suppressing deterioration of the characteristics of the select transistor.

The present inventors first examined the relationship between the writing speed and the writing voltage of the memory transistor.

Figure 1:
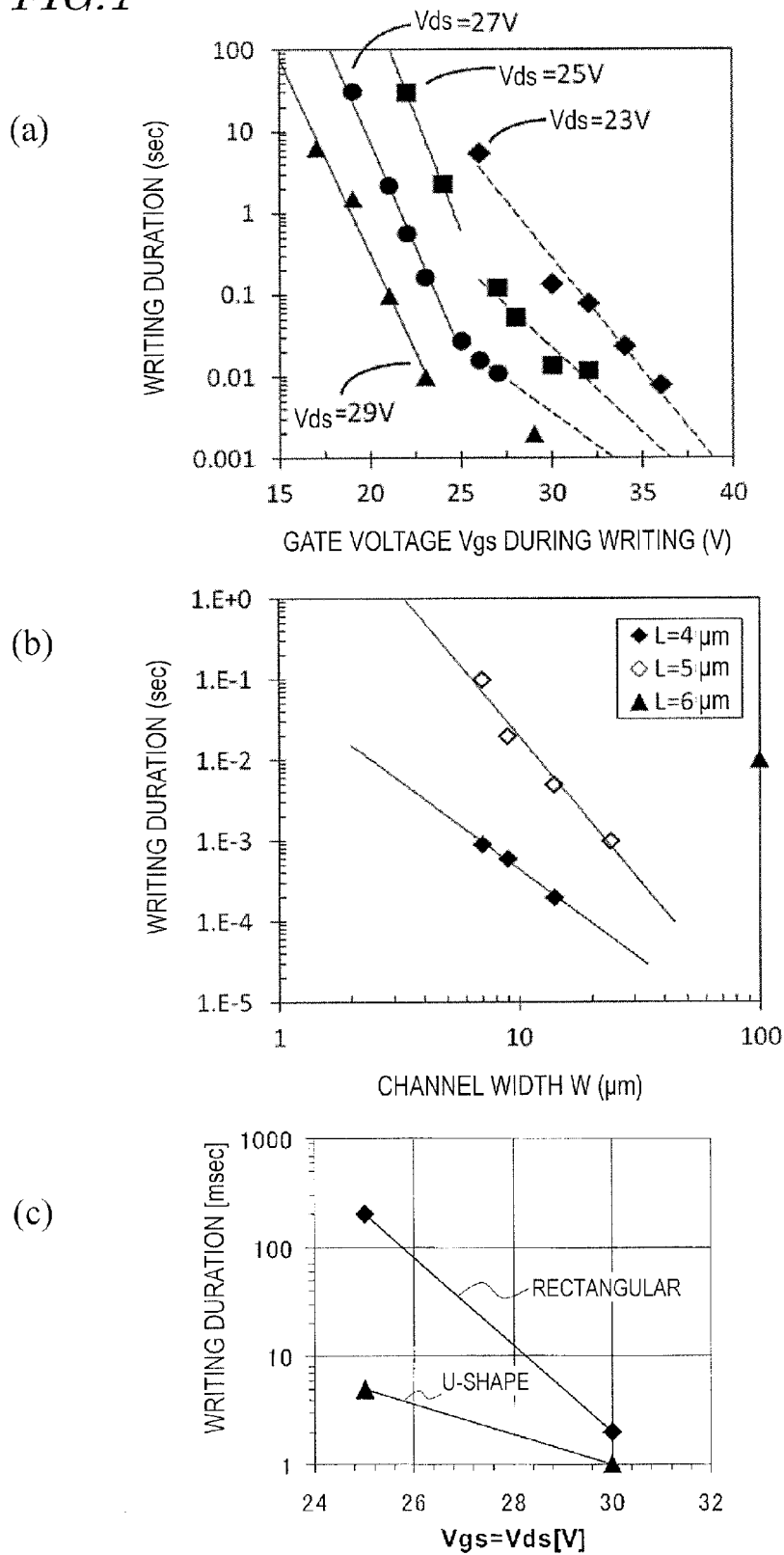
[FIG. 1] (a) is a graph illustrating the relationship between writing voltage Vds and gate voltage Vgs of a memory transistor and the writing duration. (b) is a graph illustrating the relationship between channel length L and channel width W of a memory transistor and the writing duration in the case where gate voltage Vgs applied during writing and writing voltage Vds are constant. (c) is a graph illustrating the relationship between the planar shape of a channel region and the writing duration.

FIG. 1(a) is a graph showing the relationship between writing voltage Vds and gate voltage Vgs of the memory transistor and the writing duration. The horizontal axis represents gate voltage Vgs applied during writing. The vertical axis represents the writing duration. Note that gate voltage Vgs refers to a voltage between the gate and the source, and writing voltage Vds refers to a voltage applied between the drain and the source during writing. The "writing duration" refers to a duration which is required for a metal oxide semiconductor of the memory transistor to change into a resistor while predetermined gate voltage Vgs and writing voltage Vds are applied to the memory transistor such that a drain current (write current) flows. In the specification of the present application, "writing operation" is referred to as "programming" in some cases.

It can be seen from the results shown in FIG. 1(a) that as writing voltage Vds increases, the writing duration is shorter, i.e., the writing speed increases. However, when the select transistor is formed using an oxide semiconductor film which is common among the memory transistor and the select transistor, there is a probability that application of a high writing voltage Vds to the memory transistor causes a reaction of writing (decrease of the resistance in the channel region) in the select transistor, leading to variation in the characteristics of the select transistor. In a configuration where the same select transistor is used in writing and reading, there is a probability that the characteristics of the select transistors are affected in the reading due to the effects caused in the writing.

In view of such, the present inventors considered the channel length and the channel width of the transistors and carried out researches concerning a configuration where the writing duration is sufficiently longer and the reaction of writing occurs at a higher voltage in the select transistor than in the memory transistor. Here, the writing duration does not simply depend on only the amount of Joule heat produced in the channel region during writing. Even when the amount of produced Joule heat is equal, it is estimated that the duration required for reducing the resistance of the channel region (writing duration) can be shortened by utilizing the Joule heat more efficiently.

FIG. 1(b) shows the relationship between channel length L and channel width W of the memory transistor and the writing duration in the case where gate voltage Vgs applied during writing and writing voltage Vds are constant (Vgs=30 V, Vds=30 V). The horizontal axis represents channel width W of the memory transistor. The vertical axis represents the writing duration.

It can be seen from the results shown in FIG. 1(b) that as channel length L decreases, the writing duration is shorter. This is probably because an electric current which flows between the drain and the source during writing (write current), Ipp, increases and the amount of produced Joule heat increases, and in addition, the Joule heat can be utilized more efficiently for change of the characteristics of the channel region.

It can also be seen that as channel width W increases, the writing duration is shorter. This is probably because the amount of produced Joule heat increases due to increased write current Ipp, and in addition, the temperature can be increased at central part of the channel region (central part in terms of the channel width direction), and at least a portion at the center of the channel region can be converted to a conductor more efficiently.

Here, from the viewpoint of suppressing the characteristic variation which occurs in the select transistor due to writing in the memory transistor while increasing the writing speed of the memory transistor, it is preferred that a writing reaction in the memory transistor occurs with a shorter writing duration and a lower writing voltage. Meanwhile, it is preferred that a writing reaction in the select transistor only occurs with a sufficiently long writing duration and a sufficiently high writing voltage as compared with the writing reaction in the memory transistor.

The present inventors examined the results shown in FIGS. 1(a) and 1(b) from such a viewpoint and obtained the following knowledge.

It is preferred that, between a select transistor which is present in a write current path of a memory transistor and a memory transistor included in the same memory cell, at least one of the following conditions (1) to (5) holds true. In this case, the Joule heat of the select transistor during a writing operation can be minimized, and the writing reaction of the select transistor can be suppressed. As a result, the writing speed of the memory transistor can be improved while variation of the characteristics of the select transistor is suppressed.

(1) The channel length of a select transistor is greater than the channel length of a memory transistor which is selected by the select transistor in a writing operation.

(2) The select transistor consists of a plurality of select transistors, and the plurality of select transistors are electrically connected in parallel with one another and share an identical gate control line.

(3) The channel width of each of the plurality of select transistors is smaller than the channel width of the memory transistor.

(4) The ratio of the channel width to the channel length in each of the plurality of select transistors is smaller than the ratio of the channel width to the channel length in the memory transistor.

(5) The sum of the channel widths of the plurality of select transistors is greater than the channel width of the memory transistor.

Note that, to more surely suppress the variation in the characteristics of the select transistor, it is preferred that the above-described relationship (4) holds true. If at least one of the above-described relationships (1) to (4) holds true, there is a probability that the current drive capability of the select transistor decreases. Therefore, from the viewpoint of more surely securing the current drive capability of the select transistor, it is more preferred that at least the above-described relationship (5) holds true.

Next, the present inventors examined the device configuration of the memory transistor and found that the writing characteristics also vary depending on that device configuration. For example, when the memory transistor has a configuration which readily produces Joule heat or a configuration in which the produced Joule heat is unlikely to diffuse, higher writing characteristics can be realized. In one example, the planar shape of the channel region is designed so as to more efficiently utilize the Joule heat, whereby the writing duration can be shortened.

FIG. 1(c) is a graph showing the relationship between the planar shape of the channel region and the writing duration. The horizontal axis represents gate voltage Vgs and writing voltage Vds (where Vgs=Vds). The vertical axis represents the writing duration. Here, a memory transistor in which the planar shape of the channel region is rectangular and a memory transistor in which the planar shape of the channel region is a U-shape were examined as to the writing duration. Note that the channel width and the channel length of these memory transistors are equal, and the dimensions other than the planar shape of the channel region (the thickness of the active layer, the material and thickness of the gate insulating film, etc.) are also equal.

It can be seen from the results shown in FIG. 1(c) that when the channel region has a U-shape, Joule heat produced from the write current can be more efficiently utilized for writing than in a case where the channel region has a rectangular shape. The reasons for this are as follows. In the case where the channel region has a U-shape, one of the drain electrode and the source electrode is surrounded by the other when viewed in a direction normal to the substrate. Thus, the current density is higher at the surrounded electrode so that produced Joule heat is greater than that produced at the other electrode. As a result, the resistance of the oxide semiconductor decreases due to the Joule heat, and the writing operation is enhanced. Note that the planar shape of the channel region is not limited to a U-shape. The same effects are produced so long as the channel region has such a shape that the current density locally increases.

Therefore, other than the above-described relationships (1) to (5), by configuring the memory transistor and the select transistor so as to have different planar shapes of the channel regions, the writing speed of the memory transistor can be further increased while variation in the characteristics due to writing in the select transistor can be suppressed more effectively. For example, in the case where the above-described relationship (3) holds true while the channel region of the memory transistor has a U-shape and the channel region of the select transistor has a rectangular shape when viewed in a direction normal to the substrate, the difference in writing duration between the memory transistor and the select transistor can be further increased, and greater effects are achieved by a synergistic effect.

Note that the results shown in FIGS. 1(a) and 1(b) are the results of an examination with the use of a memory transistor whose channel region is rectangular when viewed in a direction normal to the substrate. However, it is expected that a similar tendency arises even when the planar shape of the channel region is not rectangular (e.g., U-shape).

The present inventors found, based on the foregoing knowledge, a configuration in which writing in the memory transistor is completed within a predetermined writing duration and the writing duration of the select transistor can be sufficiently long, and arrived at the present invention.

Hereinafter, embodiments of a semiconductor device according to the present invention are described with reference to the attached drawings.

(First Embodiment)

The first embodiment of the semiconductor device of the present invention is a nonvolatile semiconductor storage device including a plurality of memory cells arranged in row and column directions (hereinafter, referred to as "nonvolatile memory array"). The memory cells include a memory transistor and a plurality of select transistors.

(Configuration of Memory Cell 101)

FIG. 2(a) is a cross-sectional view showing a memory transistor 10A and a select transistor 10B in a memory cell 101 of the present embodiment. FIGS. 2(b) and 2(c) are plan views of the memory transistor 10A and the select transistor 10B, respectively. FIG. 2(a) shows cross-sectional structures taken along line I-I' of FIG. 2(b) and line II-II' of FIG. 2(c).

The memory cell 101 includes a substrate 1, a memory transistor 10A supported on the substrate 1, and a plurality of select transistors 10B each supported on the substrate 1. These transistors 10A, 10B have active layers (oxide semiconductor layers) 7A, 7B which are formed from a common oxide semiconductor film. Note that FIGS. 2(a) and 2(c) show the configuration of representative one of the plurality of select transistors 10B. The configuration of the remaining select transistors is the same as that shown in FIGS. 2(a) and 2(c). However, the present invention is not limited to this example. The plurality of select transistors only need to have a common active layer (oxide semiconductor layer) and may have different configurations (for example, configurations which are different in terms of the channel length and channel width).

The memory transistor 10A is a nonvolatile memory device which is capable of being irreversibly changed from a state where drain current Ids depends on gate-source voltage Vgs (referred to as "semiconductor state") to a state where drain current Ids does not depend on gate-source voltage Vgs (referred to as "resistor state"). Here, drain current Ids refers to an electric current which flows between the source and the drain of the memory transistor 10A.

The above-described state change can be caused by, for example, applying a predetermined writing voltage Vpp at a predetermined time between the drain and the source of the memory transistor 10A which is in a semiconductor state (initial state). Application of the writing voltage Vpp causes an electric current to flow through part of an active layer 7A in which a channel is to be formed (channel region 7cA), thereby producing Joule heat. Due to this Joule heat, the resistance of the channel region 7cA of the active layer 7A decreases. As a result, the memory transistor 10A changes to a resistor state so that it does not depend on gate-source voltage Vgs but exhibits an ohmic characteristic. Although the reasons for the decrease of the resistance of the oxide semiconductor are not yet elucidated, it is estimated that oxygen included in the oxide semiconductor diffuses out of the channel region 7cA due to the Joule heat, and the number of oxygen deficiencies inside the channel region 7cA increases so that carrier electrons are produced. Note that a memory transistor which is capable of such a state change is disclosed in Patent Document 3 of the present applicant and in Japanese Patent Applications Nos. 2012-137868 and 2012-231480 of the present applicant which are not yet laid open to public inspection. The entire disclosures of these are incorporated by reference in the specification of the present application.

In the present embodiment, the design value for the memory transistor 10A and the select transistor 10B are optimized such that the relationship between channel length L1 and channel width W1 of the memory transistor 10A and channel length L2 and channel width W2 of the select transistor 10B meets at least one of the above-described relationships (1) to (5).

Thus, the writing reaction of the memory transistor occurs with a shorter writing duration and a lower writing voltage. Meanwhile, the writing reaction of the select transistor only occurs with a sufficiently long writing duration and a sufficiently high writing voltage as compared with the writing reaction of the memory transistor. As a result, variation of the characteristics which occurs in the select transistor due to writing in the memory transistor can be suppressed while the writing speed of the memory transistor is increased.

More preferably, the sum of channel widths W2 of the plurality of select transistors is set so as to be greater than channel width W1 of the memory transistor 10A. This setting enables to sufficiently secure the current drive capability of the select transistors 10B and to surely suppress variation of the characteristics of the select transistors 10B which is attributed to a writing operation.

Thus, according to the present embodiment, for example, even when the same voltage is applied to the memory transistor 10A and the select transistors 10B such that a drain current flows, it is possible that a writing operation is completed in the memory transistor 10A and the memory transistor 10A transitions to a resistor state. Also, a writing operation in the select transistors 10B is not completed so that the select transistors 10B are maintained at the initial semiconductor state. If the drain current is shut off at the time when the writing operation in the memory transistor 10A is completed, only the memory transistor 10A can transition to a resistor state.

Now, specific configurations of the transistors 10A, 10B are described.

The memory transistor 10A includes an active layer 7A which is formed from an oxide semiconductor film, a gate electrode 3A, a gate insulating film 5 which is present between the active layer 7A and the gate electrode 3A, a source electrode 9sA which is arranged so as to be in contact with part of the active layer 7A, and a drain electrode 9dA which is arranged so as to be in contact with another part of the active layer 7A. When viewed in a direction normal to the substrate 1, at least part of the active layer 7A is arranged so as to extend over the gate electrode 3A with the gate insulating film 5 interposed therebetween. Note that the active layer 7A may not be in direct contact with the source electrode 9sA or the drain electrode 9dA so long as the active layer 7A is electrically connected with the source electrode 9sA and the drain electrode 9dA. Part of the active layer 7A which is in contact with the source electrode 9sA (or part of the active layer 7A which is electrically connected with the source electrode 9sA) is referred to as "source contact region". Part of the active layer 7A which is in contact with the drain electrode 9dA (or part of the active layer 7A which is electrically connected with the drain electrode 9dA) is referred to as "drain contact region". When viewed in a direction normal to the substrate 1, part of the active layer 7A which extends over the gate electrode 3A with the gate insulating film 5 interposed therebetween and which is present between the source contact region and the drain contact region forms the channel region 7cA. In the specification of the present application, a length in a channel direction of the channel region 7cA is referred to as "channel length L1", and a length of the channel region 7cA in a direction perpendicular to the channel direction is referred to as "channel width W1".

In the present embodiment, the entire active layer 7A extends over the gate electrode 3A, and the active layer 7A is in direct contact with the source electrode 9sA and the drain electrode 9dA. In such a case, channel length L1 of the memory transistor 10A corresponds to a length in the channel direction of the gap between the source electrode 9sA and the drain electrode 9dA above the active layer 7A when viewed in a direction normal to the substrate 1. Channel width W1 corresponds to a length of the gap in a direction perpendicular to the channel direction.

In the illustrated example, when viewed in a direction normal to the substrate 1, one of the drain electrode 9dA and the source electrode 9sA (here, the drain electrode 9dA) has a recess above the active layer 7A. The other electrode (here, the source electrode 9sA) is provided in the recess of the drain electrode 9dA so as to be spaced away from the drain electrode 9dA. Therefore, the channel region 7cA which is present between the source electrode 9sA and the drain electrode 9dA has a U-shape. In such a case, as shown in FIG. 2(b), the width of the gap between the source electrode 9sA and the drain electrode 9dA is channel length L1. The length of a line in the channel region 7cA on which the distance from the source electrode 9sA and the distance from the drain electrode 9dA are equal to each other (the length of a line formed by midpoints of the distance between the source electrode 9sA and the drain electrode 9dA above the active layer 7A) is channel width W1.

The select transistor 10B includes an active layer 7B formed from an oxide semiconductor film which is common among the active layer 7A and the active layer 7B, a gate electrode 3B, a gate insulating film 5 which is present between the active layer 7B and the gate electrode 3B, a source electrode 9sB which is arranged so as to be in contact with part of the active layer 7B, and a drain electrode 9bB which is arranged so as to be in contact with another part of the active layer 7A. When viewed in a direction normal to the substrate 1, the gate electrode 3B is arranged so as to extend over at least part of the active layer 7B. As in the above-described memory transistor 10A, the active layer 7B includes a source contact region which is in contact with (or electrically connected with) the source electrode 9sB, a drain contact region which is in contact with (or electrically connected with) the drain electrode 9bB, and a channel region 7cB. When viewed in a direction normal to the substrate 1, the channel region 7cB is a region which extends over the gate electrode 3B with the gate insulating film 5 interposed therebetween and which is present between the source contact region and the drain contact region of the active layer 7B. In the illustrated example, channel length L2 of the select transistor 10B is a length in the channel direction of the gap between the source electrode 9sB and the drain electrode 9bB above the active layer 7B, and channel width W2 is a length of the gap in a direction perpendicular to the channel direction.

In the present embodiment, the channel region 7cA of the memory transistor 10A has a U-shape, and the channel region 7cB of the select transistor 10B has a rectangular shape. Therefore, in the memory transistor 10A, Joule heat produced by a write current can be more efficiently utilized in decreasing the resistance of the channel region 7cA (writing). Further, channel width W1 can be increased without increasing the size of the active layer 7A. That is, the above-described relationship (3) can be easily realized. Therefore, the difference in writing speed between the memory transistor 10A and the select transistor 10B can be further increased. Thus, variation in the characteristics of the select transistor 10B which is attributed to writing in the memory transistor 10A can be suppressed more surely.

In the present embodiment, the gate electrodes 3A, 3B of the memory transistor 10A and the select transistor 10B are formed from a common electrically-conductive film for the gate. The gate insulating film 5 of the memory transistor 10A extends up to the select transistor 10B and also functions as a gate insulating film of the select transistor 10B. The source electrodes 9sA, 9sB and the drain electrodes 9dA, 9bB of the memory transistor 10A and the select transistor 10B are formed from a common electrically-conductive film for the source. Thus, the select transistor 10B and the memory transistor 10A can be formed through a common process, and accordingly, the number of manufacturing steps can be reduced.

Figure 2:
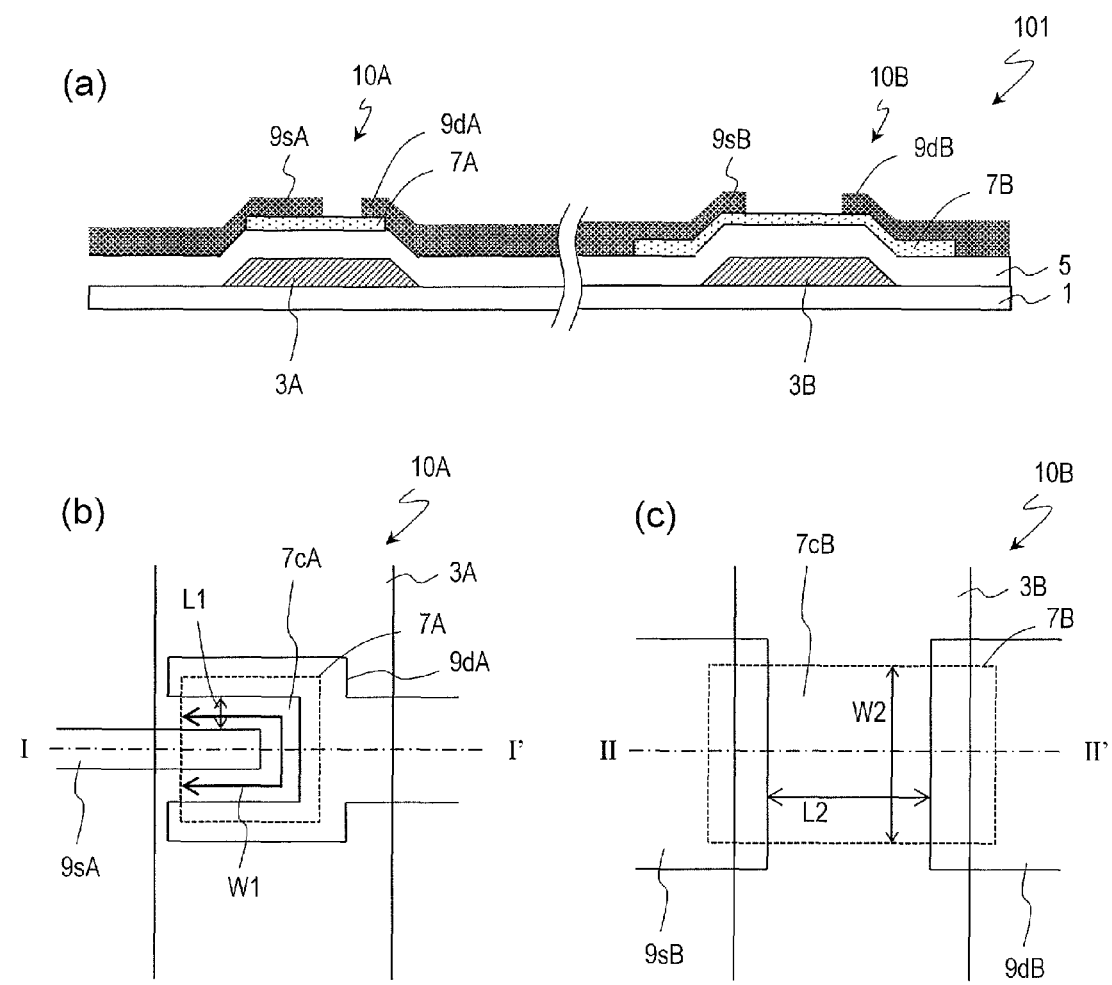
[FIG. 2] (a) is a cross-sectional view showing a memory transistor 10A and a select transistor 10B in a memory cell 101. (b) and (c) are plan views of the memory transistor 10A and the select transistor 10B, respectively.

Note that the planar shape of the channel region 7cA of the memory transistor 10A may be rectangular although it is a U-shape in the example illustrated in FIG. 2. Likewise, the planar shape of the channel region 7cB of the select transistor 10B may be a U-shape although it is rectangular in the illustrated example. Note that, however, the U-shape of the channel region 7cB leads to a probability that decrease of the resistance of the channel region 7cB is enhanced. Therefore, for example, it is necessary to make channel length L2 sufficiently longer than channel length L1 such that a writing reaction in the select transistor 10B is suppressed.

The memory transistor 10A and the select transistor 10B are not limited to a bottom gate configuration but may have a top gate configuration. Note that, however, if the memory transistor 10A and the select transistor 10B have the same configuration, these transistors 10A, 10B can be formed through a common process, and accordingly, the number of manufacturing steps can be reduced.

The oxide semiconductor film that forms the active layers 7A, 7B of the memory transistor 10A and the select transistor 10B is, for example, an In—Ga—Zn—O based semiconductor film. Here, the In—Ga—Zn—O based semiconductor is a ternary oxide consisting of In (indium), Ga (gallium) and Zn (zinc). The proportion (composition ratio) of In, Ga and Zn is not limited to the present embodiment but includes, for example, In:Ga:Zn=2:2:1, In:Ga:Zn=1:1:1, and In:Ga:Zn=1:1:2. In the present embodiment, the active layers 7A, 7B may be an In—Ga—Zn—O based semiconductor layer which includes In, Ga and Zn in a proportion of In:Ga:Zn=1:1:1, for example.

A TFT (Thin Film Transistor) which includes an In—Ga—Zn—O based semiconductor layer has high mobility (20 times or more as compared with an a-Si TFT) and low current leakage (less than 1/100 as compared with an a-Si TFT). When a TFT which includes an In—Ga—Zn—O based semiconductor layer is used, the power consumption of a display device can be greatly reduced.

The In—Ga—Zn—O based semiconductor may be amorphous or may include a crystalline portion. As the crystalline In—Ga—Zn—O based semiconductor, a crystalline In—Ga—Zn—O based semiconductor in which the c-axis is oriented generally perpendicular to the layer surface may be used. The crystalline structure of such an In—Ga—Zn—O based semiconductor is disclosed in, for example, Japanese Laid-Open Patent Publication No. 2012-134475. The entire disclosure of Japanese Laid-Open Patent Publication No. 2012-134475 is incorporated by reference in the specification of the present application.

As the oxide semiconductor film, a different semiconductor film in which decrease of the resistance due to Joule heat can occur may be used instead of the In—Ga—Zn—O based semiconductor. For example, a semiconductor film which includes, for example, NiO, $SnO_2$, $TiO_2$, $VO_2$, $In_2O_3$, or $SrTiO_3$ may be used. Alternatively, a Zn—O based semiconductor (ZnO), an In—Zn—O based semiconductor (IZO (registered trademark)), a Zn—Ti—O based semiconductor (ZTO), a Cd—Ge—O based semiconductor, a Cd—Pb—O based semiconductor, a CdO (cadmium oxide), a Mg—Zn—O based semiconductor, an In—Sn—Zn—O based semiconductor (e.g., $In_2O_3$—$SnO_2$—ZnO), an In—Ga—Sn—O based semiconductor, or the like, may be used. Still alternatively, a film obtained by adding various impurities to these oxide semiconductors may be used.

(Operation of Memory Cell 101)

Next, the operation of a single unit of the memory cell 101 is described with reference to FIG. 3 to FIG. 12.

For example, the semiconductor state (initial state) is assigned to logical value "0", and the resistor state is assigned to logical value "1". This enables the memory transistor 10A to be used as part of a transistor which is a constituent of a memory cell 101 included in a nonvolatile memory array (storage element).

Hereinafter, an example of the configuration and operation of the memory cell 101 in which the memory transistor 10A is used is described.

Figure 3:
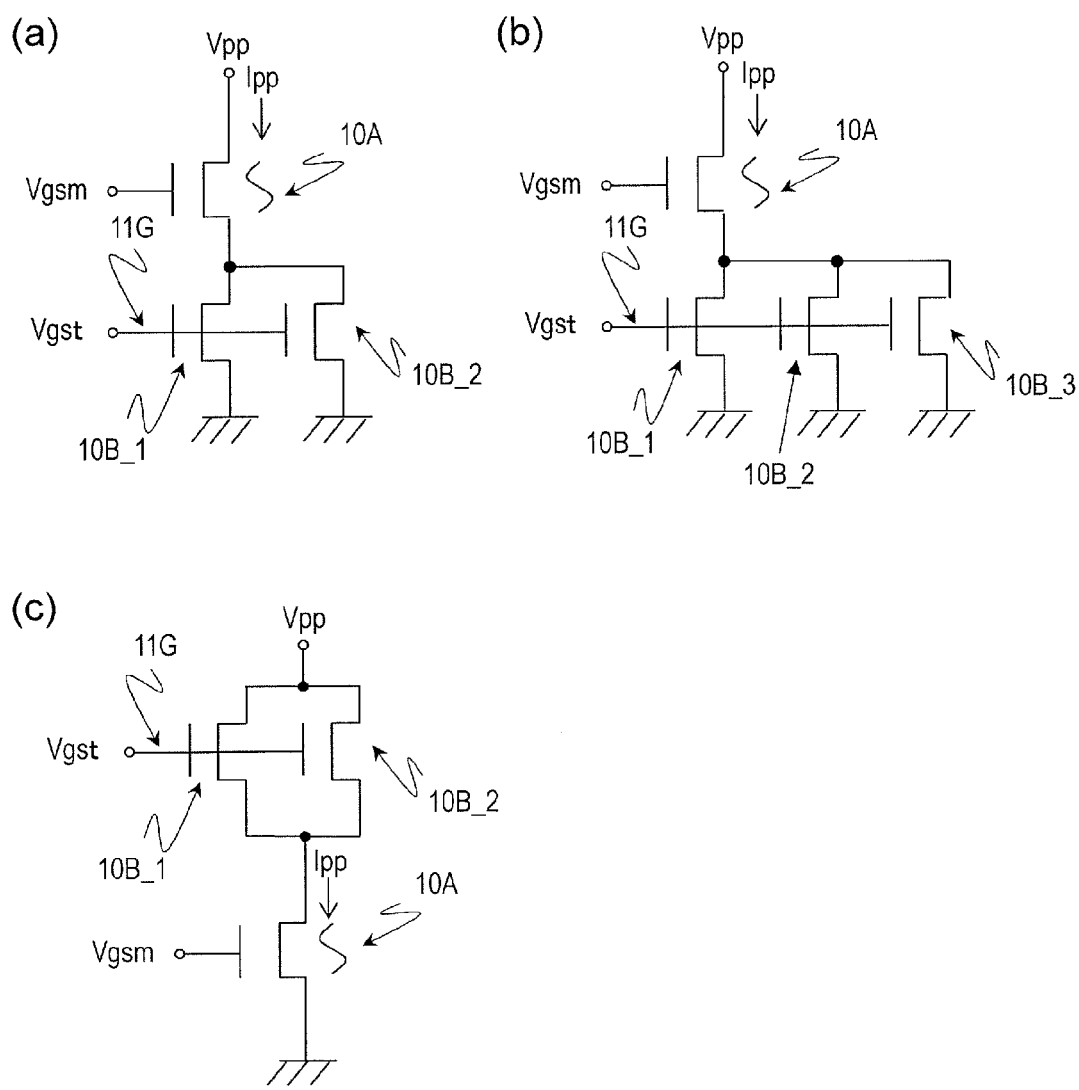
[FIG. 3] (a) to (c) are diagrams showing configuration examples of the memory cell 101.

FIG. 3 shows configuration examples where a plurality of select transistors 10B are electrically connected in parallel with one another. FIG. 3(*a*) shows an example where two select transistors 10B_1 and 10B_2 are electrically connected in parallel and the source electrodes of the select transistors 10B_1 and 10B_2 are grounded.

The memory cell 101 of the present embodiment includes a plurality of select transistors 10B. The plurality of select transistors 10B are electrically connected in parallel with one another. As shown in FIG. 3(*a*), the memory cell 101 includes, for example, two select transistors 10B_1 and 10B_2. The select transistors 10B_1 and 10B_2 are electrically connected in parallel with each other and share an identical gate control line 11G. Common gate-source voltage Vgst is applied to the select transistors 10B_1 and 10B_2 via the gate control line 11G. The select transistor 10B_1 and the memory transistor 10A are electrically connected in series, and the select transistor 10B_2 and the memory transistor 10A are electrically connected in series. In the present embodiment, an example where the source electrodes of the select transistors 10B_1 and 10B_2 are grounded is illustrated although, as a matter of course, they only need to be fixed to reference voltage Vss.

In the memory cell 101 shown in FIG. 3(*a*), common gate-source voltage Vgst is applied to the select transistors 10B_1 and 10B_2 via a gate control line 10G, so that the select transistors 10B_1 and 10B_2 transition to an ON state. Thereby, a writing operation in the memory transistor 10A is enabled. When gate-source voltage gsm is applied to the memory transistor 10A, the memory transistor 10A transitions to an ON state. When drain voltage (writing voltage) Vpp is applied to the memory transistor 10A, drain current Ids flows through the memory transistor 10A. Accordingly, Joule heat is produced in the channel region of the memory transistor 10A, so that the memory transistor 10A is in a resistor state. This state is assigned to, for example, logical value "1".

Common gate-source voltage Vgst is applied to the select transistors 10B_1 and 10B_2 via the gate control line 10G, so that the select transistors 10B_1 and 10B_2 transition to an ON state. Thereby, a reading operation of the memory transistor 10A is enabled. A gate voltage which is at a low level such that the memory transistor 10A would not transition to an ON state is applied to the memory transistor 10A.

When reading drain voltage (reading voltage) Vdr is applied in this state, drain current Ids does not flow through the memory transistor 10A, and no electric current flows through the select transistors 10B_1 and 10B_2, so long as the memory transistor 10A is in the semiconductor state (initial state). On the other hand, if the memory transistor 10A is in the resistor state, drain current Ir which is determined according to reading drain voltage Vdr flows through the memory transistor 10A, and an electric current also flows through the select transistors 10B_1 and 10B_2.

As described herein, the select transistors 10B_1 and 10B_2 are used for selection of a memory transistor 10A which is to be subjected to writing or reading.

Now, typical examples of the channel length and the channel width in each transistor are described. Channel length L1 of the memory transistor 10A is set to, for example, 4 μm. Channel width W1 of the memory transistor 10A is set to, for example, 14 μm. Channel length L2 of each of the select transistors 10B is set to, for example, 6 μm. Channel width W2 of the select transistor 10B is set to, for example, 10 μm. By thus optimizing the design values, all of the above-described relationships (1) to (5) hold true. As a result, the difference in writing speed between the memory transistor 10A and the select transistors 10B_1 and 10B_2 can be further increased, and variation in the characteristics of the select transistors 10B_1 and 10B_2 which is attributed to writing in the memory transistor 10A can be suppressed more surely.

Note that the channel length and the channel width of each transistor can be appropriately changed according to the design and specifications so long as at least one of the above-described relationships (1) to (5) holds true. The select transistors 10B_1 and 10B_2 do not need to have common channel length and channel width and can be designed independently.

FIG. 3(*b*) shows an example where three select transistors 10B_1, 10B_2 and 10B_3 are electrically connected in parallel and the source electrodes of the select transistors 10B_1, 10B_2 and 10B_3 are grounded. In the configuration illustrated in FIG. 3(*b*), common gate-source voltage Vgst is applied to the three select transistors 10B via the gate control line 10G as in the configuration of FIG. 3(*a*). Thus, the select transistors 10B_1, 10B_2 and 10B_3 are in an ON state, and a writing or reading operation of the memory transistor 10A is possible.

It is estimated that, as the number of the select transistors increases, particularly the above-described relationships (4) and (5) are more easily achieved. From such a viewpoint, it is preferred that the memory cell 101 includes three or more select transistors rather than two select transistors. Further, it is more preferred that the memory cell 101 includes four or more select transistors.

FIG. 3(*c*) shows an example where two select transistors 10B_1 and 10B_2 which are electrically connected in parallel are provided on the high potential (Vpp) side and the source electrode of the memory transistor 10A is grounded. In the configuration illustrated in FIG. 3(*c*), common gate-source voltage Vgst is applied to the select transistors 10B_1 and 10B_2 via the gate control line 10G, so that the select transistors 10B_1 and 10B_2 transition to an ON state. Thereby, a writing or reading operation of the memory transistor 10A is enabled. Note that, however, to increase the writing speed, it is preferred that drain-source voltage Vds in the memory transistor 10A is set to a higher value. From such a viewpoint, a configuration where the select transistors are provided on the GND side as shown in FIGS. 3(*a*) and 3(*b*) is preferred.

Now, details of a writing operation in the memory transistor 10A are described with reference to FIG. 4 and FIG. 5.

Figure 4:
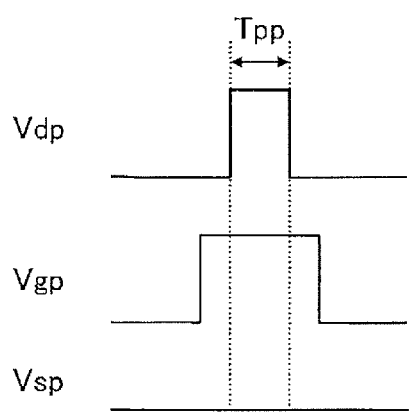
[FIG. 4] (a) to (d) are diagrams schematically showing four patterns of typical examples of the voltage waveforms of voltages Vdp, Vgp, and Vsp applied to respective terminals in the memory transistor 10A.
Figure 4:
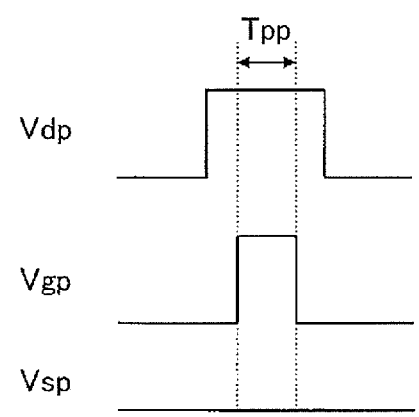
Figure 4:
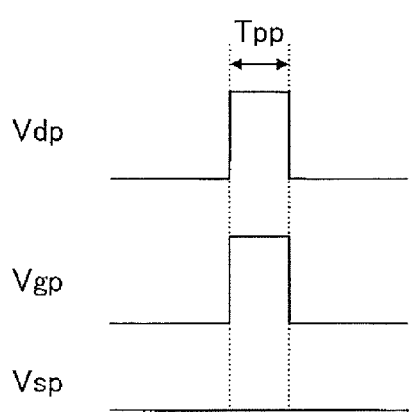
Figure 4:
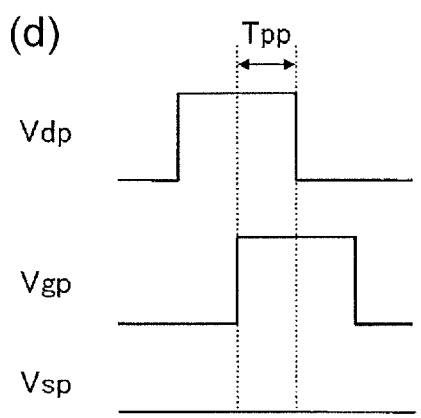

FIG. 4 schematically shows four patterns of typical examples of the voltage waveforms of voltages Vdp, Vgp, and Vsp applied to respective terminals in the memory transistor 10A. FIG. 5 shows the relationships of voltages applied to respective terminals of the memory transistor 10A whose source electrode is grounded.

Figure 5:
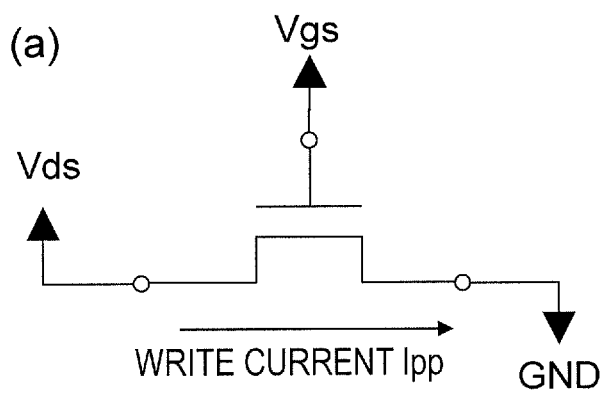
[FIG. 5] (a) and (b) are diagrams showing the relationships of voltages applied to respective terminals of the memory transistor 10A whose source electrode is grounded.
Figure 5:
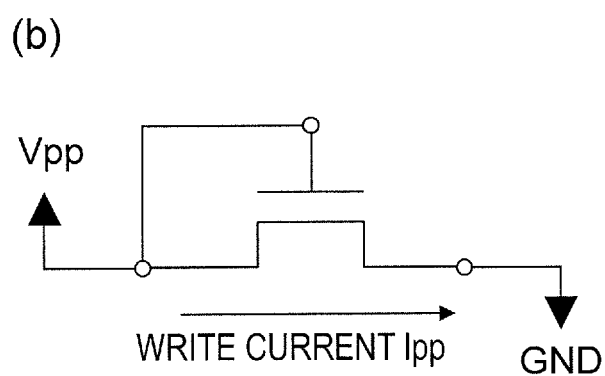
Figure 6:
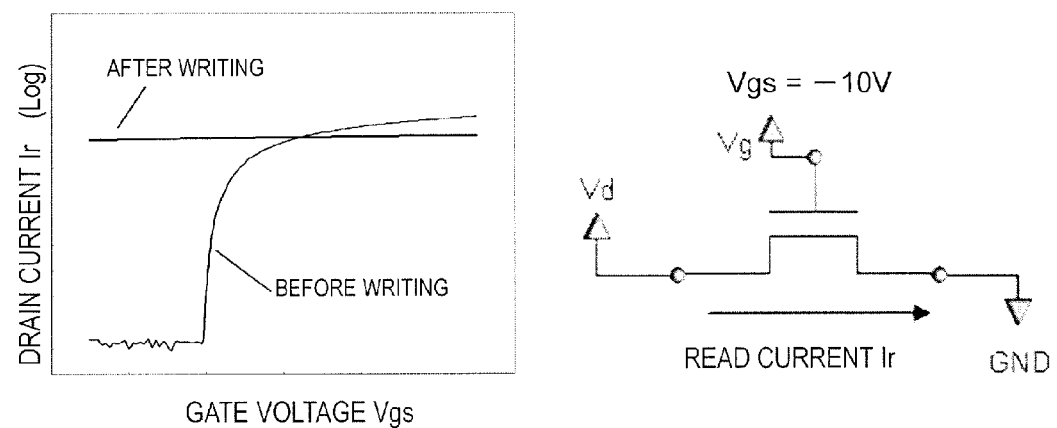
[FIG. 6] (a) is a diagram showing the relationship between gate voltage Vgs and drain current Ir before and after writing. (b) is a diagram showing the relationship between drain voltage Vds and the resistance between the drain and the source and drain current Ir after writing.
Figure 6:
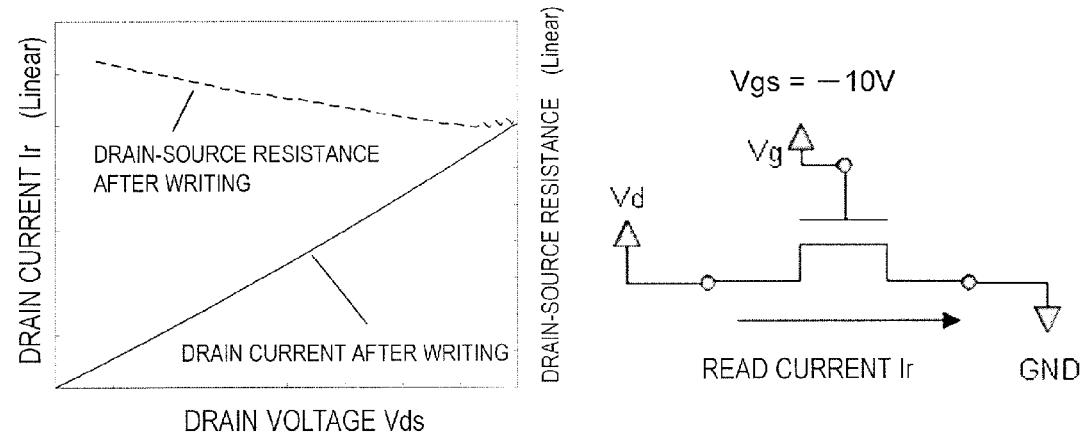
Figure 7:
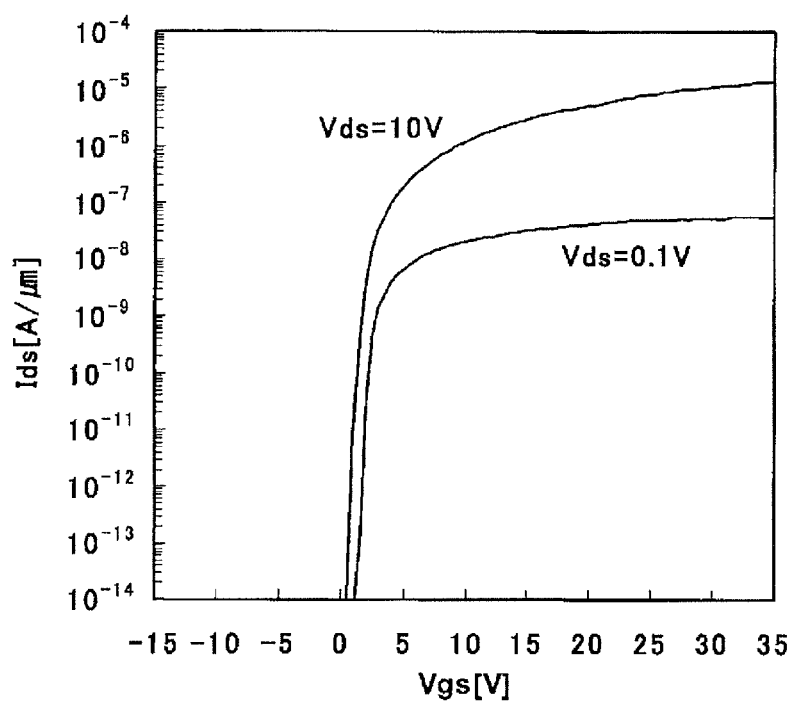
[FIG. 7] (a) is a graph showing the Ids-Vgs characteristic in the initial state of the memory transistor 10A. (b) is a graph showing the Ids-Vds characteristic in the initial state of the memory transistor 10A.
Figure 7:
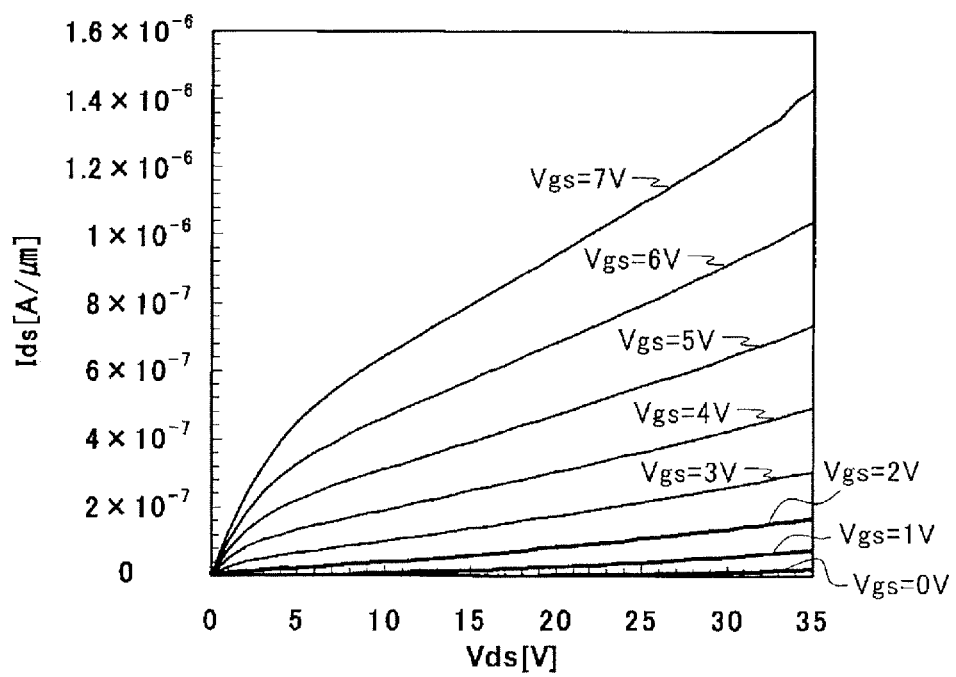
Figure 8:
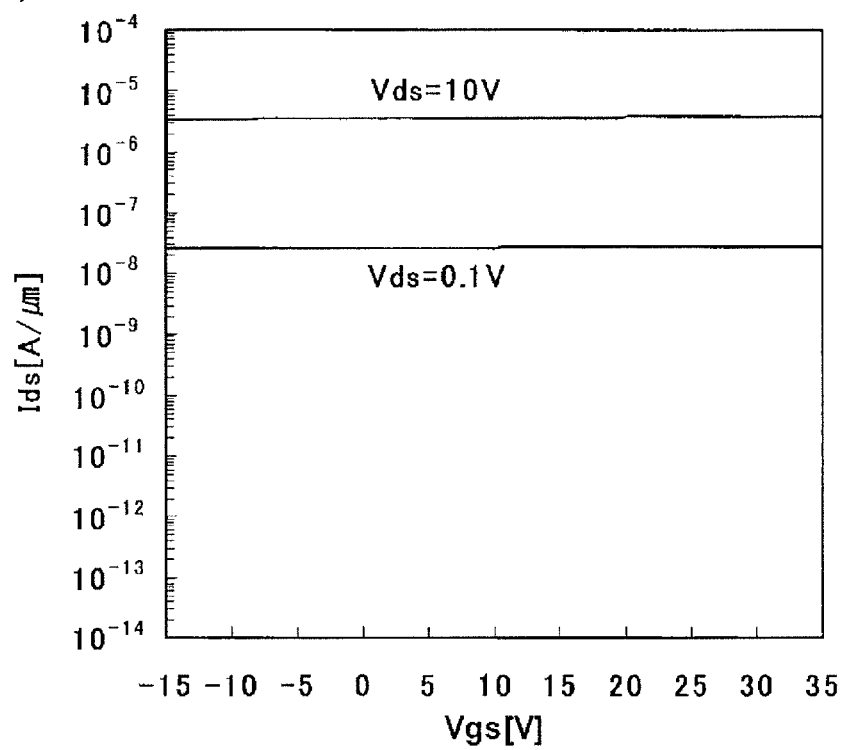
[FIG. 8] (a) is a graph showing the Ids-Vgs characteristic after a writing operation of the memory transistor 10A. (b) is a graph showing the Ids-Vds characteristic after a writing operation of the memory transistor 10A.
Figure 8:
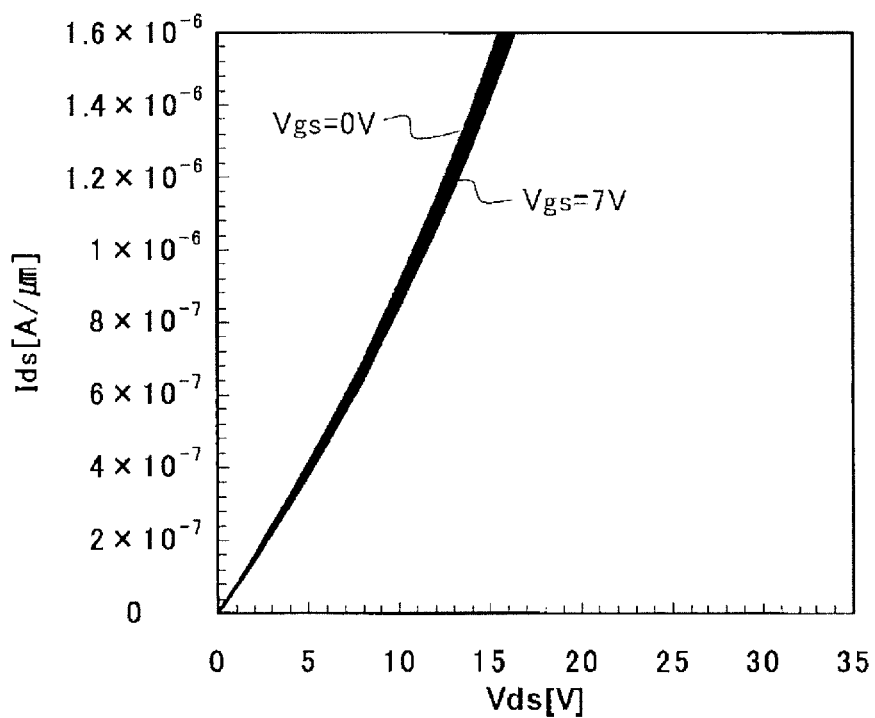

As illustrated in FIG. 5(*a*), a predetermined reference voltage Vss is applied to the source electrode of the memory transistor 10A. Note that, in the illustration of FIG. 5(*a*), the source electrode of the memory transistor 10A is grounded, and reference voltage Vss is at the GND level. A predetermined writing drain voltage Vds is applied to the drain electrode of the memory transistor 10A, and a predetermined writing gate voltage Vgs is applied to the gate electrode of the memory transistor 10A. Here, a period in which the application duration of writing drain voltage Vds and the application duration of writing gate voltage Vgs overlap is referred to as "writing period Tpp".

In any of the four patterns illustrated in FIGS. 4(a) to 4(d), voltage Vds(=Vdp−Vsp) is applied between the drain and the source of the memory transistor 10A, and voltage Vgs(=Vgp−Vsp) is applied between the gate and the source of the memory transistor 10A. The memory transistor 10A which is in the initial state transitions to an ON state, and write current Ipp flows between the drain and the source during writing period Tpp. Note that, as previously described, source voltage Vsp is a voltage at the GND level.

When write current Ipp flows through the drain and the source of the memory transistor 10A, writing power Pw which is represented by the product of drain-source voltage Vds and write current Ipp(=Vds×Ipp) occurs. This power is consumed by the channel region of the active layer 7A, so that Joule heat is produced according to writing power Pw, and the channel region is heated. As a result, the memory transistor 10A transitions from the initial state to the resistor state.

Here, in the case where writing gate voltage Vgs is given, the memory transistor 10A is in a driving state in a saturated region when writing drain voltage Vds is not less than (Vgs−Vthm). Writing current Ipp is approximately determined based on formula 1 and formula 2 shown below and reaches the maximum at the given gate-source voltage Vgs.

$$Ipp=(1/2)\times \beta m\times (Vgs-Vthm)^2 \quad \text{(formula 1)}$$

$$\beta m=\mu m\times C_{OXm}\times Wm/Lm \quad \text{(formula 2)}$$

In formula 1 and formula 2, βm, Vthm, βm, $C_{OXm}$, Wm, and Lm are the transconductance of the memory transistor 10A, the threshold voltage of the memory transistor 10A, the mobility of the active layer 7A, the electrostatic capacity of the gate insulating film 5, the channel width of the memory transistor 10A, and the channel length of the memory transistor 10A, respectively.

As shown in FIG. 5(b), in the case where writing voltage Vpp is given, the maximum writing power Pw is obtained when Vpp=Vgs=Vds holds true, and an efficient writing operation is enabled.

By applying writing voltage Vpp while the substrate temperature has been increased beforehand, the electric power required for increase of the temperature can be reduced. Further, by increasing the speed of reaching a temperature which is necessary for the state change of the active layer, writing can be performed at a higher speed, and writing can be performed with a lower writing voltage.

Here, Ipp/W, which is obtained by dividing write current Ipp by channel width W μm, represents the value of the drain current per unit channel width (1 μm), which is herein referred to as "unit drain current". Assuming that the thickness of the active layer 7A is constant, the unit drain current (unit: A/μm) is proportional to the current density of the drain current (unit: A/m$^2$). By increasing the unit drain current (unit: A/μm), the current density of the drain current (unit: A/m$^2$) is increased. In the present embodiment, in a writing operation, the unit drain current is, for example, about 20 to 1000 pA/μm, and the writing duration is, for example, about 10 psec to 500 msec. Gate voltage Vgs applied during writing is, for example, more than 0 V and not more than 200 V, preferably not less than 30 V and not more than 100 V. Drain voltage Vds applied during writing is, for example, more than 0 V and not more than 200 V, preferably not less than 30 V and not more than 100 V. Note that voltages Vgs and Vds applied during writing are not limited to the aforementioned ranges but may be appropriately set such that a desired unit drain current flows. The unit drain current and the writing duration in a writing operation are also not limited to the aforementioned numerical ranges. The unit drain current and the writing duration can vary depending on the type and thickness of the metal oxide semiconductor used in the active layer 7A or the device configuration of the memory transistor 10A.

Now, points to be considered as to writing power Pw are described below.

In determining writing power Pw, the temperature in the channel region is sufficiently low such that melting away of the channel region or disconnection due to electromigration of the elements that are constituents of the active layer would not occur. The temperature in the channel region can be set to, for example, about 200° C. to 900° C. such that the chemical composition ratio of the active layer can change.

Next, details of a reading operation from the memory transistor 10A are described.

FIG. 6(a) shows the relationship between gate voltage Vgs and drain current Ir before writing (semiconductor state) and after writing (resistor state). FIG. 6(b) shows the relationship between drain voltage Vds and the resistance between the drain and the source and drain current Ir after writing (resistor state).

As illustrated in FIGS. 6(a) and 6(b), during reading, a predetermined reference voltage Vss is applied to the source electrode of the memory transistor 10A. Note that, in the illustration of FIGS. 6(a) and 6(b), the source electrode of the memory transistor 10A is grounded, and reference voltage Vss is at the GND level. A predetermined reading drain voltage Vd is applied to the drain electrode of the memory transistor 10A, and a predetermined reading gate voltage Vg is applied to the gate electrode of the memory transistor 10A. Thereby, voltage Vd (=Vd−Vss) is applied between the drain and the source of the memory transistor 10A, and voltage Vg (=Vg−Vss) is applied between the gate and the source of the memory transistor 10A.

Here, voltage Vg is set so as to be lower than threshold voltage Vth determined when the memory transistor 10A is in a semiconductor state before a writing operation. Typically, reading gate voltage Vg can be set to "−10 V". When the memory transistor 10A is in a semiconductor state, the memory transistor 10A is in an OFF state. As a result, even when voltage Vd is applied between the drain and the source, no read current Ir flows. Even if read current Ir should flow, it would be very small.

On the other hand, when the memory transistor 10A is in a resistor state, the current-voltage characteristic of the drain and the source of the memory transistor 10A does not depend on reading gate voltage Vg but exhibits an ohmic characteristic. Therefore, read current Ir which is determined according to voltage Vd and the resistance characteristic flows between the drain and the source. Thus, it can be easily determined whether the memory transistor 10A is in a semiconductor state or a resistor state by determining whether or not read current Ir flows between the drain and the source of the memory transistor 10A or by comparing the values of read current Ir.

In FIG. 6(a), the horizontal axis represents gate voltage Vgs, and the vertical axis represents drain current Ir. Note that the vertical axis is in logarithmic scale. As shown in FIG. 6(a), before writing (semiconductor state), the carrier density in the channel region is controlled by gate voltage Vg. Thus, the current-voltage characteristic between the drain and the source of the memory transistor 10A depends on reading gate voltage Vg and exhibits a transistor characteristic.

On the other hand, after writing (resistor state), the carrier density in the channel region remains high and cannot be controlled by gate voltage Vg. The value of read current Ir does not depend on gate voltage Vg but is generally constant. Thus, the current-voltage characteristic between the drain and the source of the memory transistor 10A exhibits an ohmic characteristic.

In the example of FIG. 6(a), reading gate voltage Vg is a negative voltage (−10 V), and the memory transistor 10A which is in a semiconductor state is in an OFF state. It can be seen that, in this case, the read current ratio of about $10^8$ is obtained between the semiconductor state and the resistor state. Therefore, it can be easily determined whether the memory transistor 10A is in a semiconductor state or a resistor state.

In FIG. 6(b), the horizontal axis represents drain voltage Vds, and the vertical axis represents drain current Ir and the source-drain resistance. As shown in FIG. 6(b), in a semiconductor state after writing, the relationship between drain voltage Vds and reading drain current Ir exhibits an ohmic characteristic which is generally approximate to a straight line. The resistance between the drain and the source (the differential resistivity obtained from the current-voltage characteristic) does not depend on drain voltage Vds but is generally constant. A slight change can be detected, but a large change is not found. Thus, in a semiconductor state after writing, the transistor characteristic is not detected.

As described above, in the memory transistor 10A which is in a resistor state, the electrical conductivity of the channel region is not controlled by the gate voltage. As a result, even when a gate-source voltage which is equivalent to a voltage that causes a common MOS transistor to transition to an OFF state is applied, an electric current continues to flow through the channel region. The current-voltage characteristic of reading drain current Ir exhibits considerable linearity, i.e., a characteristic which is close to the ohmic characteristic, as compared with that of a MOS transistor.

(Electric Characteristics of Memory Transistor 10A)

Now, the electric characteristics of the memory transistor 10A are described with reference to FIG. 12 to FIG. 17.

As the memory transistor 10A, an n-channel type thin film transistor was manufactured in which an In—Ga—Zn—O based semiconductor was used as the oxide semiconductor. The electric characteristics of the manufactured transistor were measured before and after writing. In the memory transistor 10A used for the measurement, channel length L1 was 4 μm, channel width W1 was 20 μm, the thickness of the active layer (oxide semiconductor layer) 7A was 20-100 nm, and the planar shape of the channel region 7cA was a rectangular shape or a U-shape.

Immediately after manufacture (initial state), the memory transistor 10A exhibits the same transistor characteristics as a normal thin film transistor. That is, drain current Ids (an electric current flowing from the drain electrode to the source electrode) varies depending on each of gate voltage Vgs (a voltage applied to the gate electrode relative to the source electrode) and drain voltage Vds (a voltage applied to the drain electrode relative to the source electrode).

FIG. 7(a) is a graph which illustrates the Ids-Vgs characteristic in the initial state of the memory transistor 10A where Vds=0.1 V and Vds=10 V. FIG. 7(b) is a graph which illustrates the Ids-Vds characteristic in the initial state of the memory transistor 10A where Vgs was changed from 0 to 7 V stepwise by 1 V. Note that, in FIGS. 7(a) and 7(b), the value of drain current Ids refers to the value of the unit drain current.

As clearly seen from FIGS. 7(a) and 7(b), in the memory transistor 10A which is in the initial state, when gate voltage Vgs is in the range of not more than about 0.5 V (specific voltage range) while drain voltage Vds is in the range of not less than 0.1 V and not more than 10 V, the unit drain current is extremely small (for example, not more than $1 \times 10^{-14}$ A/μm). This means that the memory transistor 10A is substantially in an OFF state. When gate voltage Vgs is greater than the above-described specific voltage range, drain current Ids increases as gate voltage Vgs increases (FIG. 7(a)). Also, drain current Ids increases as drain voltage Vds increases (FIG. 7(b)).

A writing operation was performed on the memory transistor 10A which was in the initial state, and the electric characteristics after the writing were examined. Here, drain voltage Vds at 24 V and gate voltage Vgs at 30 V were applied to the memory transistor 10A for writing. Writing period Tpp (the conduction duration of drain current Ids) was 100 msec.

FIG. 8(a) is a graph showing the Ids-Vgs characteristic after a writing operation of the memory transistor 10A in the case where Vds=0.1 V and Vds=10 V. FIG. 8(b) is a graph showing the Ids-Vds characteristic after a writing operation of the memory transistor 10A in the case where Vgs was changed from 0 to 7 V stepwise by 1 V.

Figure 9:
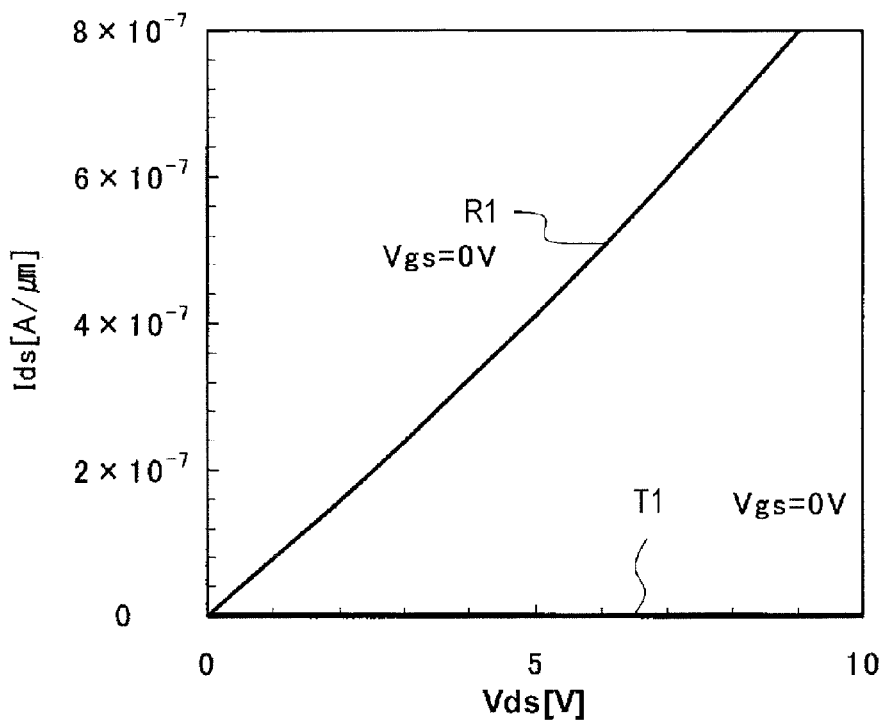
[FIG. 9] A graph enlargedly showing the Ids-Vds characteristic near the origin in the case where Vgs=0 V, in the memory transistor 10A before and after writing, for the sake of comparison of the electric characteristics exhibited before and after the writing.

FIG. 9 is a graph enlargedly showing the Ids-Vds characteristic near the origin in the case where Vgs=0 V, in the memory transistor 10A before writing (initial state) and after writing, for the sake of comparison of the electric characteristics exhibited before and after the writing. Line R1 represents the Ids-Vds characteristic before the writing. Line T1 represents the Ids-Vds characteristic after the writing.

Figure 10:
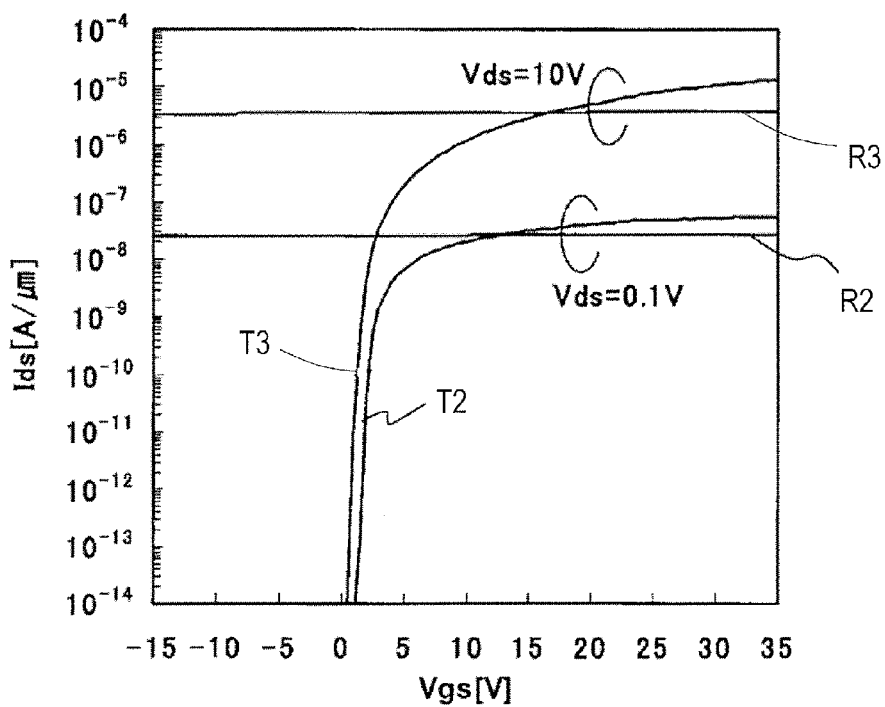
[FIG. 10] A graph superposedly showing the Ids-Vgs characteristics of the memory transistor 10A before and after writing.

FIG. 10 is a graph superposedly showing the Ids-Vgs characteristics of the memory transistor 10A before and after writing. Lines T2 and T3 represent the Ids-Vgs characteristics before writing when Vds was 0.1 V and 10 V, respectively. Lines R2 and R3 represent the Ids-Vgs characteristics after writing when Vds was 0.1 V and 10 V, respectively.

Figure 11:
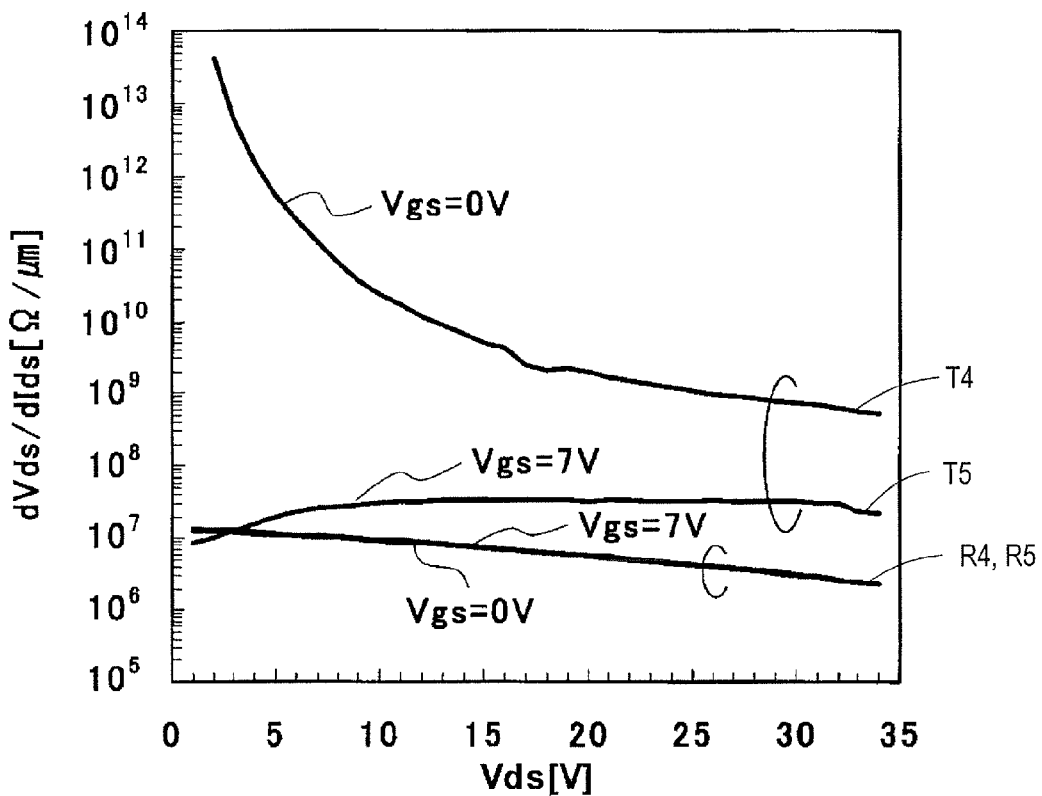
[FIG. 11] A graph showing the relationship between the differential resistivity (dVds/dIds, unit: Ωμm) obtained from the Ids-Vds characteristic and drain voltage Vds of the memory transistor 10A before and after writing.

FIG. 11 is a graph showing the relationship between the differential resistivity (dVds/dIds, unit: Ωμm) and drain voltage Vds of the memory transistor 10A before and after writing. Lines T4 and T5 represent the relationship between dVds/dIds and Vds before writing when gate voltage Vgs was 0 V and 7 V, respectively. Lines R4 and R5 represent the relationship between dVds/dIds and Vds after writing when gate voltage Vgs was 0 V and 7 V, respectively.

As clearly seen from FIGS. 8(a) and 8(b), in the memory transistor 10A after writing, drain current Ids rarely depends on gate voltage Vgs but varies mainly depending on drain voltage Vds. When drain voltage Vds is constant, drain current Ids has a generally constant value. The IV curve in each gate voltage Vgs of the Ids-Vds characteristic is generally linear irrespective of gate voltage Vgs and passes through the origin (Ids=0 A/μm, Vds=0 V). That is, it can be seen that the memory transistor 10A after writing is a resistor which exhibits an ohmic characteristic. The differential resistivity (dVds/dIds) at the origin has a finite value which is not equal to the infinity or zero (0).

In the memory transistor 10A which is in the initial state, drain current Ids varies largely depending on gate voltage Vgs when drain voltage Vds is constant. When gate voltage Vgs is within the specific voltage range (e.g., not more than about 0.5 V), drain current Ids scarcely flows, so that the memory transistor 10A is substantially in an OFF state. On the other hand, after writing, when drain voltage Vds is constant, a constant drain current Ids flows irrespective of gate voltage Vgs. When gate voltage Vgs is within the specific voltage range, the unit drain current is not less than $1\times10^{-11}$ A/μm so long as the drain voltage is within a range of not less than 0.1 V and not more than 10 V, for example.

Thus, in the memory transistor 10A, when it is in a semiconductor state, while the absolute value of the drain voltage is in a range of not less than 0.1 V and not more than 10 V, there is a voltage range for the gate voltage in which the absolute value of the unit drain current Ids/W1 is, for example, not more than $1\times10^{-14}$ A/μm. After transition to a resistor state, even when the gate voltage is set within the above-described voltage range while the absolute value of the drain voltage is in a range of not less than 0.1 V and not more than 10 V, the absolute value of the unit drain current Ids/W1 varies depending on the drain voltage and reaches a value not less than $1\times10^{-11}$ A/μm, for example.

Further, as seen from FIG. 11, the differential resistivity dVds/dIds in the initial state varies depending on gate voltage Vgs. On the other hand, the differential resistivity dVds/dIds after writing does not vary depending on gate voltage Vgs.

The electric characteristics of the memory transistor 10A are more likely to vary as the Joule heat produced in the memory transistor 10A is larger. For example, as the unit drain current Ids during writing increases, a larger amount of Joule heat can be produced.

Figure 12:
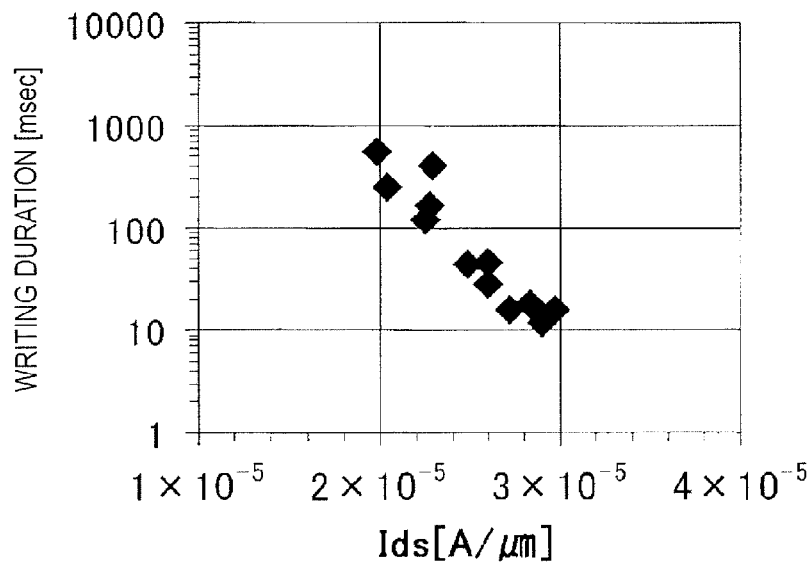
[FIG. 12] A graph showing an example of the relationship between the writing duration (unit: msec) and the unit drain current (unit: A/μm).

FIG. 12 shows an example of the relationship between the writing duration (unit: msec) and the unit drain current (unit: A/μm). As seen from FIG. 12, as the unit drain current increases, the Joule heat increases, and the writing duration can be shortened.

The unit drain current during writing can be increased by increasing gate voltage Vgs applied during writing or increasing the capacitance of the gate insulating film 5 as seen from formula 1 and formula 2 shown above. Note that, however, gate voltage Vgs applied during writing is set to a value lower than the dielectric breakdown voltage of the gate insulating film 5. Therefore, in order to further increase gate voltage Vgs applied during writing, increasing the dielectric breakdown voltage of the gate insulating film 5 is preferred. From such a viewpoint, in the present embodiment, a material of high relative permittivity is used for the gate insulating film 5 in order to secure a large electric capacitance. As an insulative material of high relative permittivity, for example, a silicon nitride film (SiN) or a silicon nitroxide film (SiNO) may be used. The relative permittivities of these films are higher than that of a silicon oxide film ($SiO_2$). The intensity of the electric field imposed on the gate insulating film 5 may be kept at a low level by increasing the thickness of the gate insulating film 5 separately from or together with selection of a high permittivity material. This enables reduction of the dielectric breakdown voltage of the gate insulating film 5. Note that when a silicon nitride film (SiN) or a silicon oxynitride film (SiON) is formed by CVD as an insulative film of high relative permittivity, hydrogen is included in these films. Therefore, when the SiN film or SiON film is in contact with the oxide semiconductor layer that is the active layer 7A, hydrogen causes a reaction with oxygen of the oxide semiconductor, and as a result, there is a probability that the active layer 7A becomes closer to a conductor. In view of such, in order to prevent direct contact between the active layer 7A and the silicon nitride film (SiN) or silicon nitroxide film (SiNO), a silicon oxide film ($SiO_2$) or silicon oxynitride film (SiON) in which the hydrogen concentration is low may be interposed therebetween.

(Nonvolatile Memory Array 1001 Including Memory Cell 101)

A nonvolatile memory array 1001 is described with reference to FIG. 13.

Figure 13:
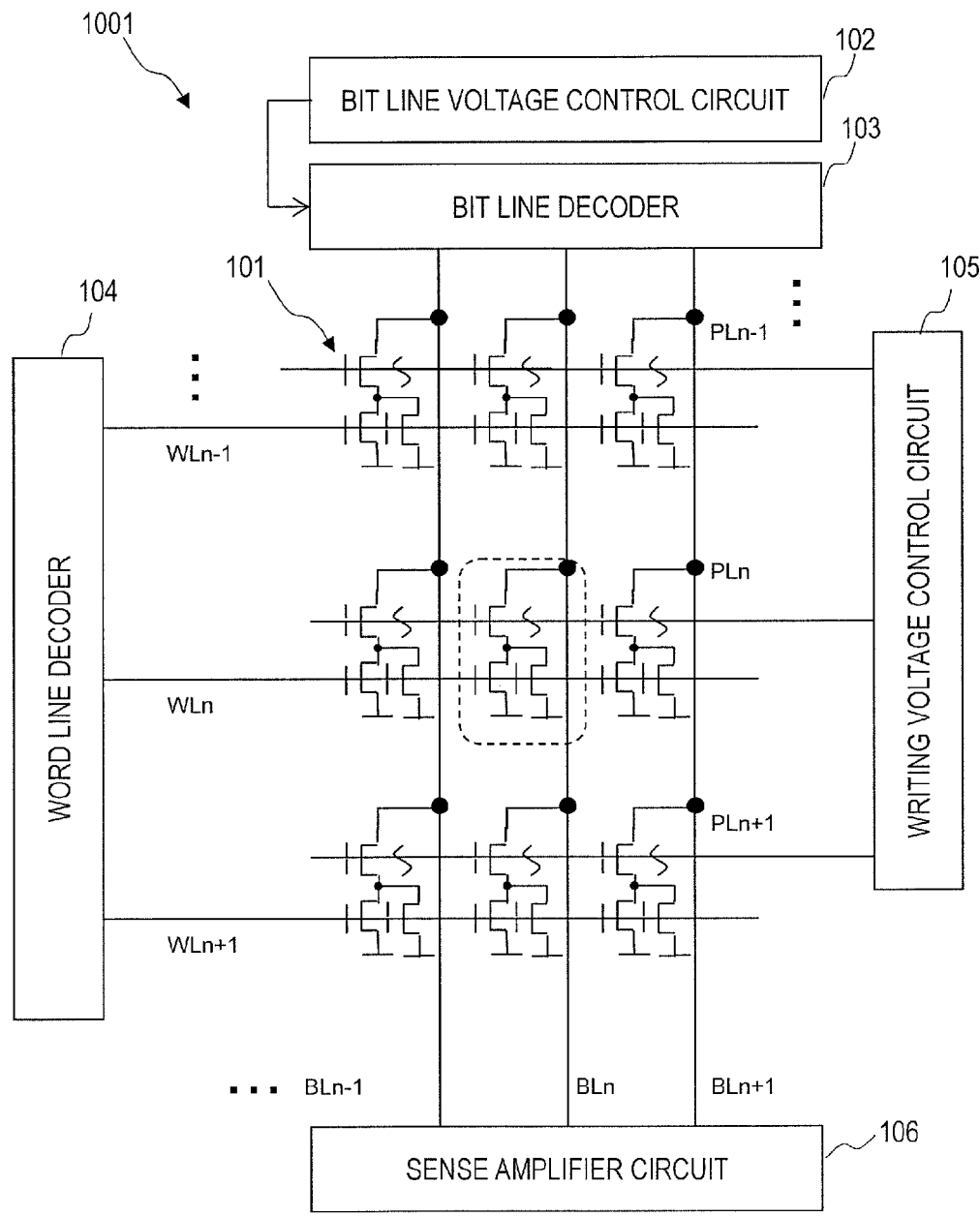
[FIG. 13] A configuration example of a nonvolatile memory array 1001 of the first embodiment.

FIG. 13 shows a configuration example of the nonvolatile memory array 1001 in which a plurality of memory cells 101 are arranged in row and column directions. The nonvolatile memory array 1001 typically includes a plurality of memory cells 101, a plurality of first word lines PL, a plurality of second word lines WL, a plurality of bit lines BL, a bit line voltage control circuit 102, a bit line decoder 103, a word line decoder 104, a writing voltage control circuit 105, and a sense amplifier circuit 106.

In the nonvolatile memory array 1001, the memory cell 101 has the same configuration as the memory cell 101 shown in FIG. 3(a). k memory cells 101 are arranged in the column direction, and l memory cells 101 are arranged in the row direction. That is, the plurality of memory cells 101 are arranged in a k×l matrix.

The plurality of first word lines PL include k word lines PLn (n=0, 1, . . . , k−1). The plurality of second word lines WL include k word lines WLn (n=0, 1, . . . , k−1). The plurality of bit lines BL include l bit lines BLn (n=0, 1, . . . , l−1).

The gate electrodes of memory transistors 10A included in memory cells 101 arranged in the same row are connected with the writing voltage control circuit 105 via a word line PLn corresponding to that row. The gate electrodes of two select transistors 10B included in memory cells 101 arranged in the same row are connected with the word line decoder 104 via a word line WLn corresponding to that row. The drain electrodes of the memory transistors 10A included in memory cells 101 arranged in the same column are connected with the bit line decoder 103 and the sense amplifier circuit 106 via a bit line BLn corresponding to that column. The source electrode of each of the select transistors included in the memory cell 101 is connected with reference voltage line (not shown). Note that, as described above, in the present embodiment, reference voltage is a voltage at the GND level.

The bit line voltage control circuit 102 generates writing voltage Vpp and reading drain voltage Vdr (voltage required for reading) which are required during writing and reading, and supplies the generated voltages to the bit line decoder 103.

The bit line decoder 103 decodes an address input from an external device and selects one or a plurality of bit lines BL connected with one or a plurality of memory cells 101 which are subjected to writing or reading. The bit line decoder 103 applies writing voltage Vpp or reading drain voltage Vdr to the selected bit lines BLn and applies unselected bit line voltage (e.g., reference voltage Vss) to unselected bit lines BLn.

The word line decoder 104 decodes an address input from an external device and selects one or a plurality of word lines WL connected with one or a plurality of memory cells 101 which are subjected to writing or reading. Further, the word line decoder 104 selects one word line WL connected with one or a plurality of memory cells 101 which are subjected to reading. The word line decoder 104 controls each word line WL so as to turn on select transistors 10B included in the selected memory cell 101 and turn off select transistors 10B included in the unselected memory cell 101. Specifically, the word line decoder 104 applies a high-level gate voltage (e.g., writing voltage Vpp) to a word line WLn connected with a selected memory cell 101 such that the select transistors 10B are turned on. The word line decoder 104 also applies low-level voltage VL to the remaining unselected word lines WLn such that the select transistors 10B are turned off.

The writing voltage control circuit 105 decodes an address input from an external device and selects one or a plurality of word lines PLn connected with one or a plurality of memory cells 101 which are subjected to writing. In a writing operation, the writing voltage control circuit 105 applies writing gate voltage (e.g., writing voltage Vpp) to the selected word lines PLn and applies low-level voltage VL to the unselected word lines PLn.

During reading, the writing voltage control circuit 105 applies low-level voltage VL (e.g., reading drain voltage Vdr) to all the word lines PLn such that the memory transistors 10A would not transition to an ON state.

The sense amplifier circuit 106 typically includes sense amplifiers which are equal in number to the total number of the bit lines BL, 1. The sense amplifier circuit 106 senses read current Ir flowing through a memory cell 101 which is subjected to reading via the bit line decoder 103 from the selected bit line BLn. Then, the sense amplifier circuit 106 determines whether the memory transistor 10A included in the memory cell 101 which is subjected to reading is in a semiconductor state (initial state) or a resistor state.

Note that the sense amplifiers included in the sense amplifier circuit 106 are typically of a current sensing type which is configured to sense read current Ir but may be of a voltage sensing type which is configured to sense a node voltage on a read current path. Instead of a circuit configuration where coupling with the bit line decoder 103 is realized via bit lines BLn, a circuit configuration where the sense amplifier circuit 106 is connected with a reference voltage line VSL which is provided independently for each column may be used.

Note that, in the nonvolatile memory array 1001 shown in FIG. 13, the bit line voltage control circuit 102, the bit line decoder 103, the word line decoder 104, and the writing voltage control circuit 105 are each formed as an independent circuit, although the present invention is not limited to this example. For example, the bit line voltage control circuit 102 and the bit line decoder 103 may be made up of a single circuit for controlling bit lines (bit line control circuit), and the word line decoder 104 and the writing voltage control circuit 105 may be made up of a single circuit for controlling word lines (word line control circuit). Alternatively, the functions of all of these circuits may be implemented in a single circuit.

Next, typical examples of writing and reading operations of the nonvolatile memory array 1001 are described.

During writing, the bit line decoder 103 applies writing voltage Vpp to the bit line BLn of a selected memory cell 101. The word line decoder 104 and the writing voltage control circuit 105 apply a voltage which is at the same level as writing voltage Vpp to a word line WLn and a word line PLn, respectively. Note that unselected bit lines BLn are in a floating state (high impedance state), and low-level voltage VL is applied to unselected word lines PLn and WLn. Note that a voltage which is at the same level as writing voltage Vpp may be applied to unselected word lines PL.

As described hereinabove, in a memory cell 101 which is subjected to writing, a writing operation in the memory transistor 10A is carried out according to the above-described writing operation in the memory transistor 10A.

During reading, the bit line decoder 103 applies a voltage required for reading to a selected bit line BLn, and the word line decoder 104 applies a high-level voltage to a selected word line WLn. Meanwhile, the writing voltage control circuit 105 applies low-level voltage VL to all the word lines PLn such that the memory transistors are not turned on.

When the memory transistor 10A included in a memory cell 101 which is subjected to reading is in a resistor state, the memory transistor 10A has electrical conductivity. Therefore, even when low-level voltage VL is applied to the word line PLn, an electric current flows through the memory transistor 10A via the bit line BLn.

On the other hand, while the memory transistor 10A included in a memory cell 101 which is subjected to reading is in a semiconductor state, i.e., stays in the initial state, when a low-level voltage VL is applied to the word line PLn, the memory transistor 10A transitions to an OFF state, so that an electric current does not flow through the memory transistor 10A via the bit line BLn.

In this way, the memory state of each of the memory cells 101 can be sensed by detecting the difference between the read currents with the use of the sense amplifiers.

To prevent deterioration of the characteristics of the select transistor 10B which is attributed to writing, it is more preferred that at least one of the relationships (6) and (7) shown below holds true in addition to the above-described relationships (1) to (5).

(6) The gate-source voltage of each select transistor 10B is equal to or greater than the gate-source voltage of the memory transistor 10A.

(7) The threshold voltage of each select transistor 10B is equal to or greater than the threshold voltage of the memory transistor 10A.

Although it is preferred that the memory cell 101 includes a plurality of select transistors, the memory cell 101 may include a single select transistor so long as the above-described relationships (1) to (7) holds true.

(Second Embodiment)

The second embodiment is described with reference to FIG. 14.

Figure 14:
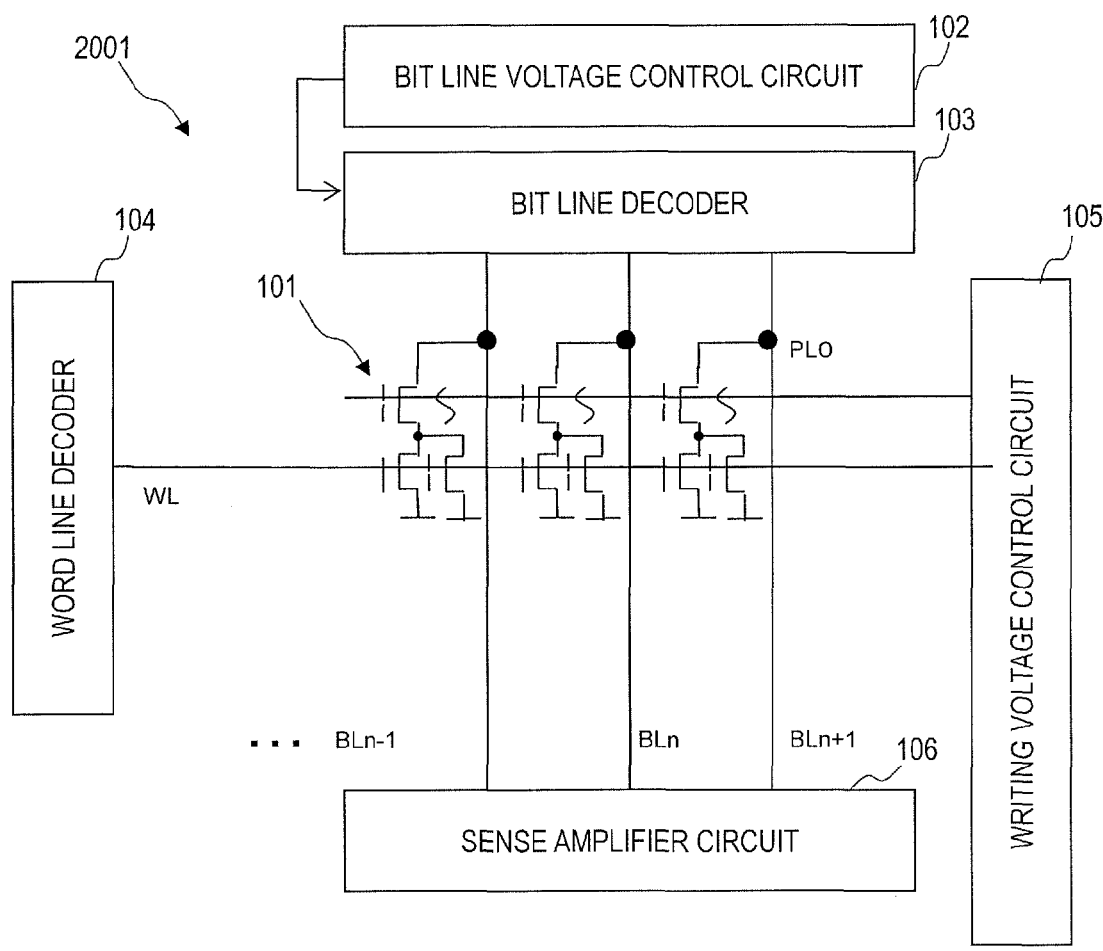
[FIG. 14] A configuration example of a nonvolatile memory array 2001 of the second embodiment.

FIG. 14 shows a configuration example of a nonvolatile memory array 2001 in which a plurality of memory cells 101 are arranged in a row direction. In the nonvolatile memory array 2001 of the present embodiment, the memory cells 101 have the same configuration as that of the memory cell 101 shown in FIG. 3(a). A single memory cell 101 is arranged only in a row direction. The other components are the same as those of the nonvolatile memory array 1001 of the first embodiment. Therefore, detailed descriptions of the respective components are omitted.

Now, typical examples of writing and reading operations of the nonvolatile memory array 2001 are described.

During writing, the bit line decoder 103 applies writing voltage Vpp to the bit line BLn of a selected memory cell 101. The word line decoder 104 and the writing voltage control circuit 105 apply a voltage which is at the same level as writing voltage Vpp to a word line WL and a word line PL0, respectively. Note that unselected bit lines BLn are in a floating state (high impedance state).

As described hereinabove, in a memory cell 101 which is subjected to writing, a writing operation in the memory transistor 10A is carried out according to the above-described writing operation in the memory transistor 10A.

During reading, the bit line decoder 103 applies a voltage required for reading to a selected bit line BLn, and the word line decoder 104 applies a high-level voltage to a word line WL. Meanwhile, the writing voltage control circuit 105 applies low-level voltage VL to the word line PL0 such that the memory transistor is not turned on.

When the memory transistor 10A included in a memory cell 101 which is subjected to reading is in a resistor state, the memory transistor 10A has electrical conductivity. Therefore, even when low-level voltage VL is applied to the word line PL0, an electric current flows through the memory transistor 10A via the bit line BLn.

On the other hand, while the memory transistor 10A included in a memory cell 101 which is subjected to reading is in a semiconductor state, i.e., stays in the initial state, when a low-level voltage VL is applied to the word line PL0, the memory transistor 10A transitions to an OFF state, so that an electric current does not flow through the memory transistor 10A via the bit line BLn.

In this way, the memory state of each of the memory cells 101 can be sensed by detecting the difference between the read currents with the use of the sense amplifiers.

(Third Embodiment)

The third embodiment is described with reference to FIG. 15.

Figure 15:
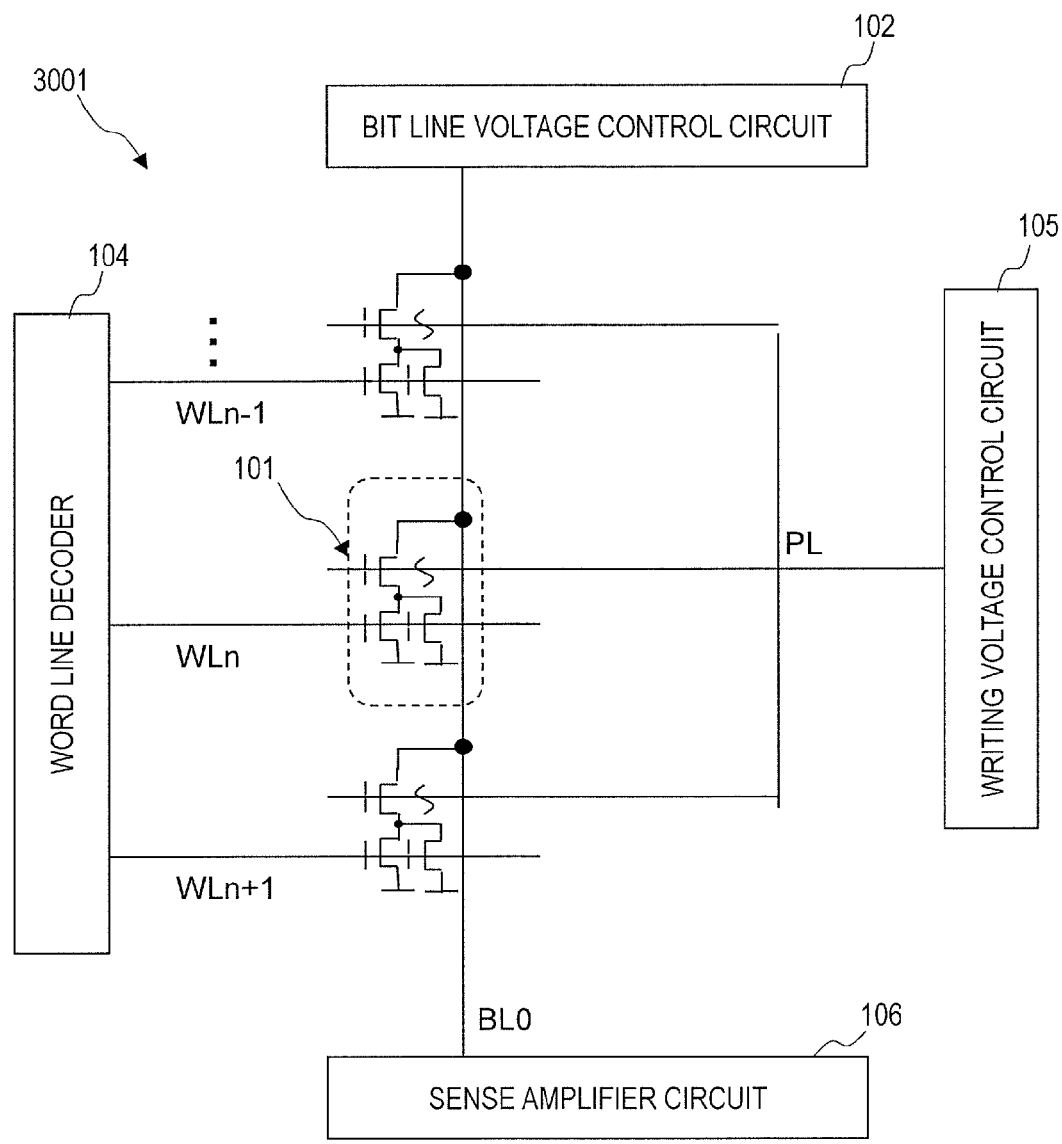
[FIG. 15] A configuration example of a nonvolatile memory array 3001 of the third embodiment.

FIG. 15 shows a configuration example of a nonvolatile memory array 3001 in which a plurality of memory cells 101 are arranged in a column direction. In the nonvolatile memory array 3001 of the present embodiment, the memory cells 101 have the same configuration as that of the memory cell 101 shown in FIG. 3(a). k memory cells 101 are arranged only in a column direction. The gate electrodes of the memory transistors 10A included in the memory cells 101 are connected with the writing voltage control circuit 105 via a common word line PL. The other components, except for the bit line decoder, are the same as those of the nonvolatile memory array 1001 of the first embodiment. Therefore, detailed descriptions of the respective components are omitted. The reason for the absence of the bit line decoder is that only one bit line BL is provided. It is not necessary to select a specific bit line BLn from a plurality of bit lines BLn according to an address input from an external device.

Now, typical examples of writing and reading operations of the nonvolatile memory array 3001 are described.

During writing, the bit line voltage control circuit 102 applies writing voltage Vpp to a bit line BL0. The word line decoder 104 and the writing voltage control circuit 105 apply a voltage which is at the same level as writing voltage Vpp to a word line WLn and a word line PL, respectively. Note that low-level voltage VL is applied to unselected WLn.

As described hereinabove, in a memory cell 101 which is subjected to writing, a writing operation in the memory transistor 10A is carried out according to the above-described writing operation in the memory transistor 10A.

During reading, the bit line decoder 103 applies a voltage required for reading to the bit line BL, and the word line decoder 104 applies a high-level voltage to a selected word line WLn. Meanwhile, the writing voltage control circuit 105 applies low-level voltage VL to the word line PL such that the memory transistor is not turned on.

When the memory transistor 10A included in a memory cell 101 which is subjected to reading is in a resistor state, the memory transistor 10A has electrical conductivity. Therefore, even when low-level voltage VL is applied to the word line PL, an electric current flows through the memory transistor 10A via the bit line BL.

On the other hand, while the memory transistor 10A included in a memory cell 101 which is subjected to reading is in a semiconductor state, i.e., stays in the initial state, when a low-level voltage VL is applied to the word line PL, the memory transistor 10A transitions to an OFF state, so that an electric current does not flow through the memory transistor 10A via the bit line BL.

In this way, the memory state of each of the memory cells 101 can be sensed by detecting the difference between the read currents with the use of the sense amplifiers.

(Fourth Embodiment)

The fourth embodiment is described with reference to FIG. 16.

Figure 16:
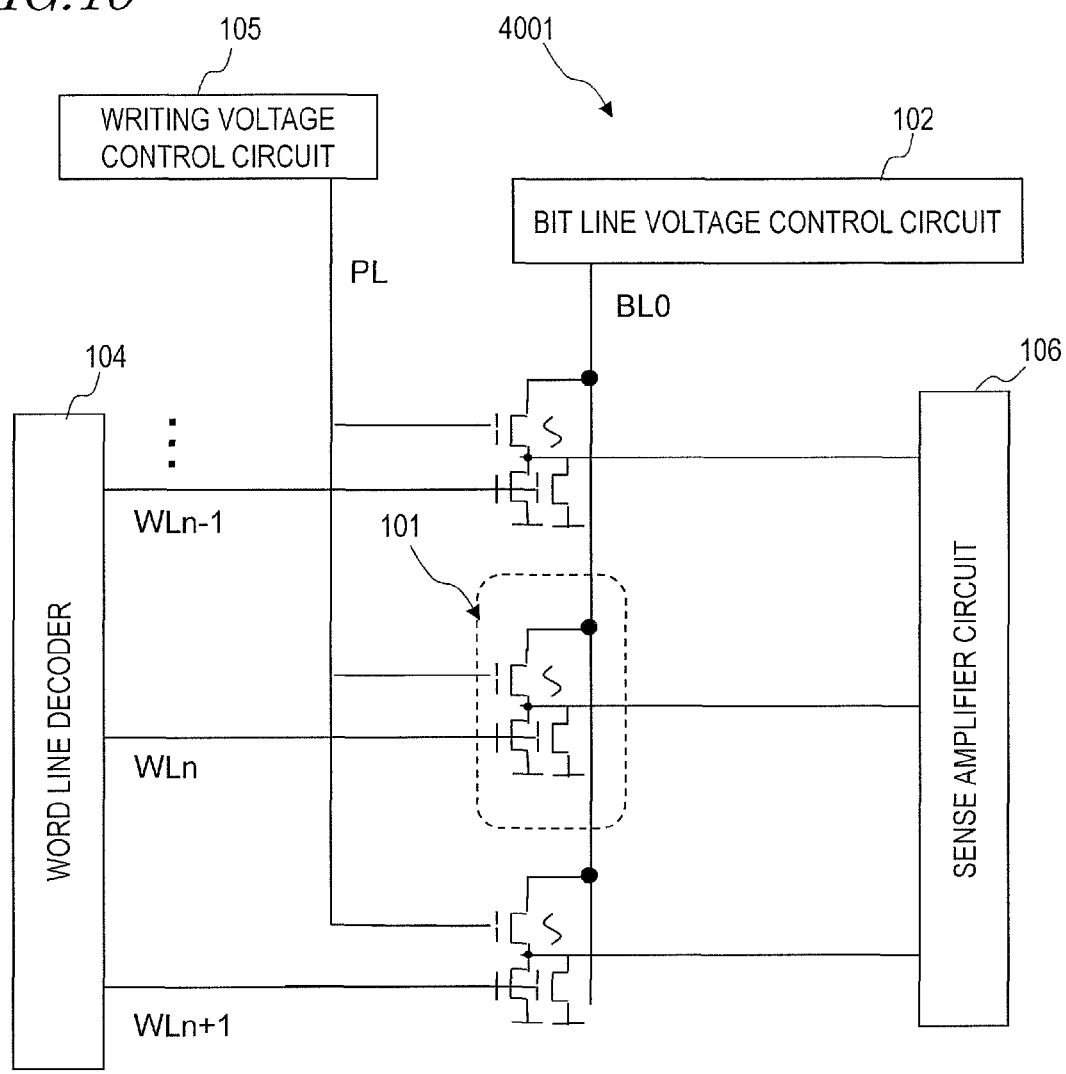
[FIG. 16] A configuration example of a nonvolatile memory array 4001 of the fourth embodiment.

FIG. 16 shows a configuration example of a nonvolatile memory array 4001 which includes a plurality of memory cells 101 arranged in a column direction but which is different from the third embodiment. In the nonvolatile memory array 4001 of the present embodiment, the memory cells 101 have the same configuration as that of the memory cell 101 shown in FIG. 3(a). k memory cells 101 are arranged only in a column direction. The gate electrodes of the memory transistors 10A included in the memory cells 101 are connected with the writing voltage control circuit 105 via a common word line PL. Further, internal nodes are formed at the connecting points of the memory transistors 10A and the select transistors 10B in the memory cells 101, and each of the internal nodes is connected with the sense amplifier circuit 106. The other components are the same as those of the nonvolatile memory array 3001 of the third embodiment. Therefore, detailed descriptions of the respective components are omitted.

Now, typical examples of writing and reading operations of the nonvolatile memory array 4001 are described.

During writing, the bit line voltage control circuit 102 applies writing voltage Vpp to a bit line BL0. The word line decoder 104 and the writing voltage control circuit 105 apply a voltage which is at the same level as writing voltage Vpp to a selected word line WLn and a word line PL, respectively. Note that low-level voltage VL is applied to unselected WLn.

As described hereinabove, in a memory cell 101 which is subjected to writing, a writing operation in the memory transistor 10A is carried out according to the above-described writing operation in the memory cell 10A.

During reading, the bit line decoder 103 applies a voltage required for reading to the bit line BL0, and the word line decoder 104 applies a high-level voltage to a selected word line WLn. Meanwhile, the writing voltage control circuit 105 applies low-level voltage VL to the word line PL such that the memory transistor is not turned on.

When the memory transistor 10A included in a memory cell 101 which is subjected to reading is in a resistor state, the memory transistor 10A has electrical conductivity. Therefore, even when low-level voltage VL is applied to the word line PL, an electric current flows through the memory transistor 10A via the bit line BL0. Accordingly, a voltage which is close to VH is output from the internal node.

On the other hand, while the memory transistor 10A included in a memory cell 101 which is subjected to reading is in a semiconductor state, i.e., stays in the initial state, when a low-level voltage VL is applied to the word line PL, the memory transistor 10A transitions to an OFF state, so that an electric current does not flow through the memory transistor 10A via the bit line BL0.

When the memory transistor 10A is in an ON state, high-level voltage VH(=reading voltage Vdr−threshold voltage Vth) is output from the internal node. When the memory transistor 10A is in an OFF state, low-level voltage VL (reference voltage Vss) is output from the internal node. In this way, the memory state of each of the memory cells 101 can be sensed by detecting the difference between the reading voltages from the internal nodes with the use of the sense amplifiers.

For example, in the present embodiment, the logical levels of VH/VL can be detected, and therefore, the sense amplifier circuit can be more simplified, as compared with a configuration such as the nonvolatile memory array 1001 of the first embodiment where a sense amplifier circuit is connected with a bit line BLn.

(Fifth Embodiment)

(Logic Circuit 200 Including Memory Transistor 10A)

Figure 17:
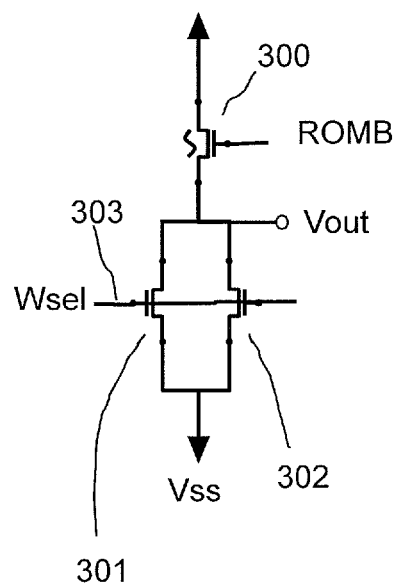
[FIG. 17] (a) is a diagram showing a basic circuit configuration of a logic circuit 200. (b) is a diagram schematically showing a writing operation of the logic circuit 200. (c) is a diagram schematically showing a reading operation of the logic circuit 200.
Figure 17:
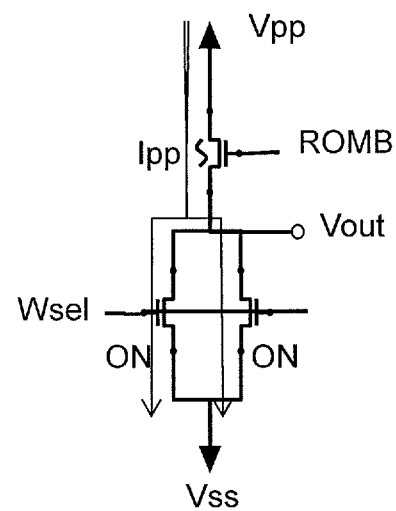
Figure 17:
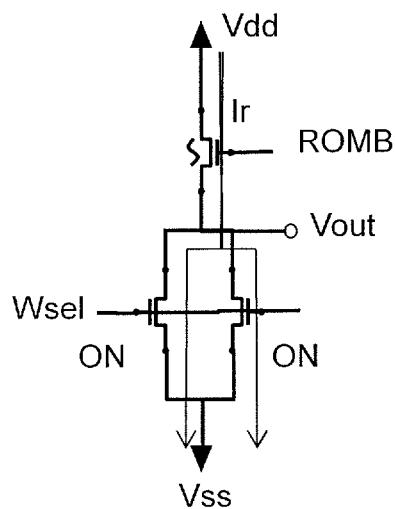

A logic circuit 200 which includes a memory transistor 10A is described with reference to FIG. 17.

A single memory cell 101 can easily be used as a logic circuit. The memory transistor 10A which is in the initial state (semiconductor state) operates in the same way as normal transistors and therefore can be utilized in part of a reading circuit. Unlike a simple resistor element such as those employed in the conventional technologies, the number of reading transistors can be reduced.

FIG. 17(a) shows a basic circuit configuration of the logic circuit 200. FIG. 17(b) schematically shows a writing operation of the logic circuit 200. FIG. 17(c) schematically shows a reading operation of the logic circuit 200. As shown in FIG. 17(a), the logic circuit 200 includes a memory element 300, a first select transistor 301, and a second select transistor 302. In the logic circuit 200, the memory transistor 10A is used as the memory element 300. An internal node N is formed at the connecting point of the memory element 300, the first select transistor 301, and the second select transistor 302. The first select transistor 301 and the second select transistor 302 are connected with a common gate control line 303 and also connected with reference voltage Vss. The basic circuit configuration shown in FIG. 17(a) is basically the same as the configuration of the memory cell 101 shown in FIG. 3(a).

The logic circuit 200 functions as an inverter circuit. This is an example application where the logic circuit 200 is used as an inverter circuit while the memory element 300, i.e., the memory transistor 10A is in a unwritten state (semiconductor state). The select transistor preferably consists of a plurality of transistors but may consist of a single transistor so long as at least one of the above-described relationships (1) to (5) holds true. Note that, in FIG. 17(a), wires and peripheral circuits for writing and reading are omitted.

Firstly, an operation in the case where the logic circuit 200 functions as an inverter circuit is described. In the specification of the present application, such an operation mode is referred to as "inverter mode". The logic circuit 200 has "memory program mode" and "memory reading mode" in addition to the inverter mode. Details of these modes will be described later.

Table 1 presented below shows the relationship of inputs and outputs of the logic circuit 200 in the respective operation modes. Here, in the logic circuit 200, the gate control line 303 functions as an input terminal, and the internal node N functions as an output terminal. Input voltage WSEL (Vin) is input to the input terminal, and Vout is output from the output terminal according to the respective operation modes.

TABLE 1

| ROMB | WSEL (Vin) | Vout unwritten state | written state | operation mode |
|---|---|---|---|---|
| Vdd | H | Vss(L) | | inverter mode |
| Vdd | L(Vss) | H | | |

TABLE 1-continued

| ROMB | WSEL (Vin) | Vout unwritten state | written state | operation mode |
|---|---|---|---|---|
| Vpp | Vpp | | | memory program (written) |
| Vpp | Vss | | | memory program (unwritten) |
| Vss | H | Vss(L) | H | memory reading |

In the inverter mode, ROMB of the memory element 300 (the gate voltage of the memory transistor 10A) is set to a high-level voltage which is equal to driving voltage Vdd. Accordingly, the memory transistor 10A is in an ON state. When a high-level voltage is input to input voltage Vin, the first select transistor 301 and the second select transistor 302 are in an ON state, so that the drain current flows through the memory transistor 10A and the first select transistor 301 and the second select transistor 302. As a result, the internal node N has a low potential, and output voltage Vout is low-level voltage Vss.

On the other hand, when a low-level voltage is input to input voltage Vin, the first select transistor 301 and the second select transistor 302 are in an OFF state, so that the drain current does not flow through the first select transistor 301 and the second select transistor 302. As a result, the internal node N has a high potential (Vdd-Vth), and output voltage Vout is high-level voltage VH. When the input is "H", the output is "L". When the input is "L", the output is "H". Thus, when the memory transistor 10A is in a unwritten state (semiconductor state), the operation of the logic circuit 200 is the same as that of a normal CMOS inverter circuit.

Next, the memory program mode is described. The memory program mode refers to a mode for carrying out programming on the memory element 300 (memory transistor 10A). A programming operation on the logic circuit 200 is the same as the above-described writing operation of the memory cell 101. In the memory program mode, ROMB of the memory element 300 (the gate voltage of the memory transistor 10A) is set to a high-level voltage which is equal to writing voltage Vpp. Accordingly, the memory transistor 10A is in an ON state. When Vin is low-level voltage VL, the select transistor would not transitions to an ON state, and therefore, writing in the memory transistor 10A is not performed (unwritten). On the other hand, when Vin is high-level voltage VH, the select transistor transitions to an ON state, so that writing in the memory transistor 10A is performed (written).

Next, the memory reading mode is described. Once the memory element 300 (memory transistor 10A) is written, the memory transistor 10A transitions to an ON state irrespective of the gate voltage, so that the output of the logic circuit 200 is always "H". By fixing ROMB of the memory element 300 (the gate voltage of the memory transistor 10A) to a low-level voltage, only an unwritten memory transistor 10A is in an OFF state. The conduction state of the memory element 300 can be distinguished according to the information written in the memory element 300. Therefore, when reading memory storage information (written information), by setting Vin to high-level voltage VH and setting ROMB of the memory element 300 (the gate voltage of the memory transistor 10A) to low-level voltage VL, low-level voltage VL is output from the logic circuit 200 which is in a unwritten state, and high-level voltage VH is output from the logic circuit 200 which is in a written state.

Thus, using the logic circuit 200 enables reading of the memory storage information directly from the internal node N without using a large-scale sense amplifier.

Note that, when each of the transistors provided in the logic circuit 200 is a CMOS transistor, it may be of the P-channel type.

(Sixth Embodiment)

A liquid crystal display device 5001 which includes a semiconductor device of the present invention is described with reference to FIG. 18 and FIG. 19.

Figure 18:
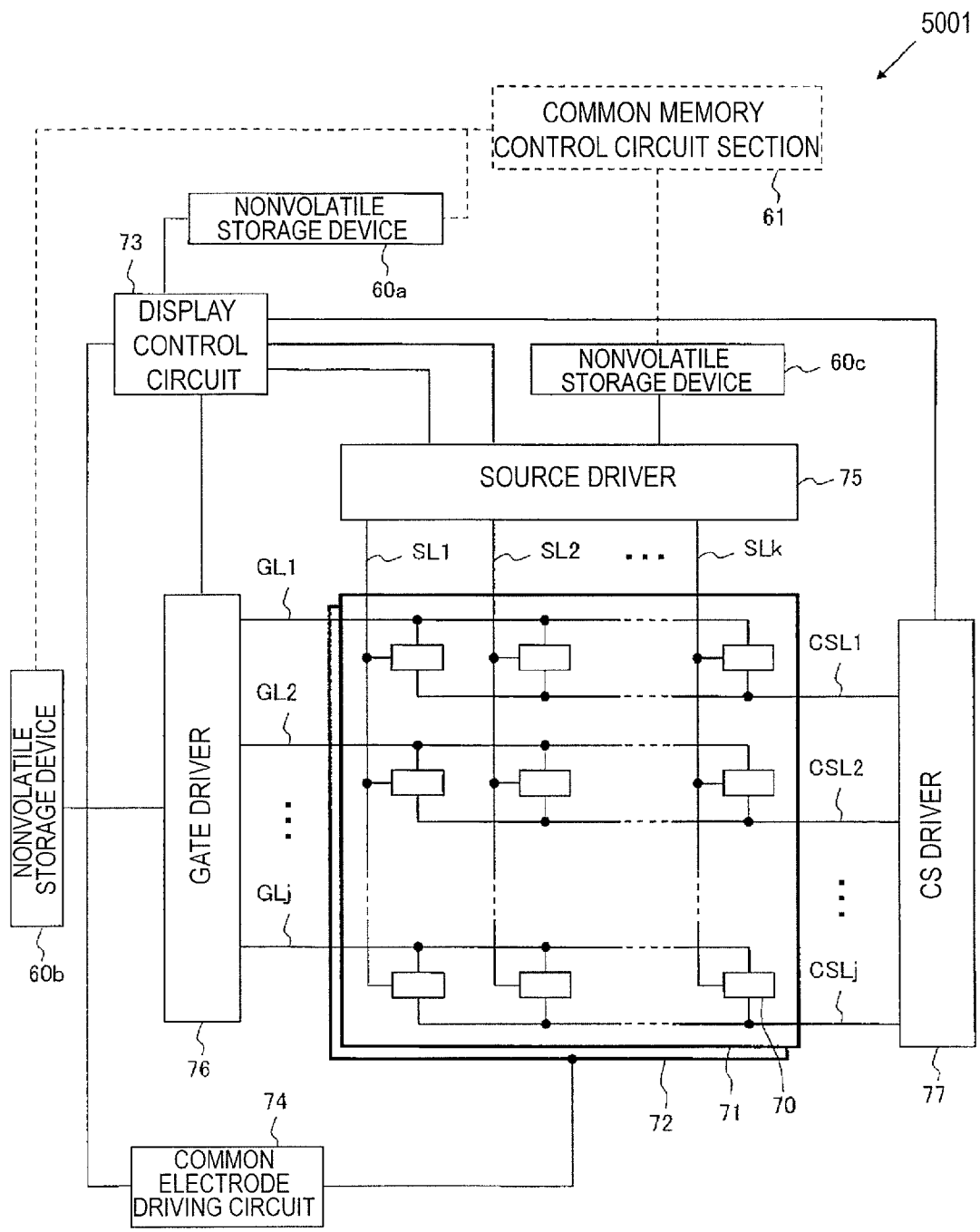
[FIG. 18] A diagram illustrating a block configuration of a liquid crystal display device 5001 in which an active matrix substrate is used.
Figure 19:
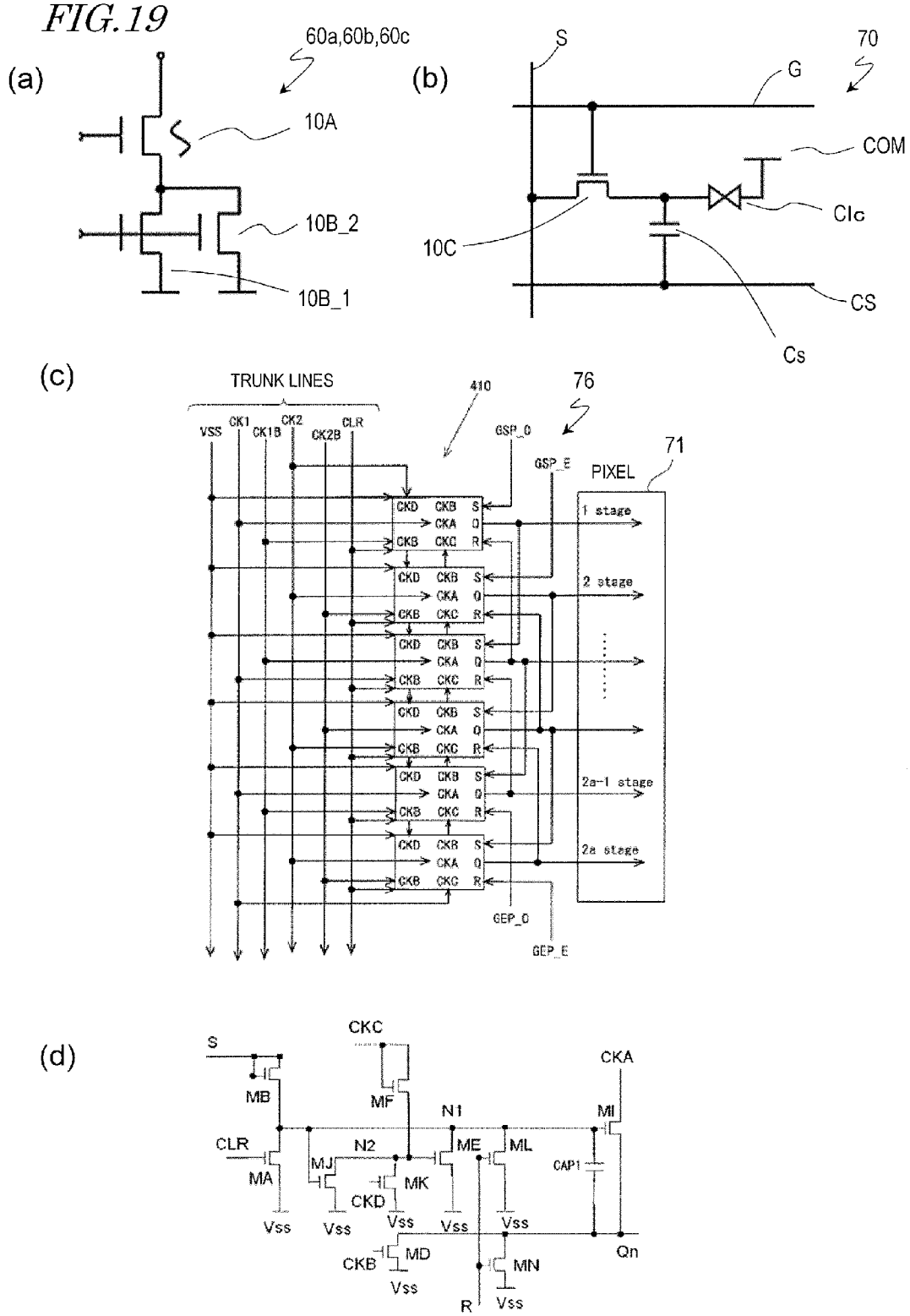
[FIG. 19] (a) to (d) are general schematic diagrams showing memory cells which are constituents of nonvolatile storage devices 60a to 60c, a pixel circuit of the liquid crystal display device 5001, a gate driver 76, and the configuration of a single stage of the gate driver 76, respectively.

FIG. 18 is a diagram illustrating a block configuration of a liquid crystal display device 5001 in which an active matrix substrate is used. FIGS. 19(a) to 19(d) are general schematic diagrams showing memory cells which are constituents of nonvolatile storage devices 60a to 60c, a pixel circuit of the liquid crystal display device 5001, a gate driver 76, and the configuration of a single stage of the gate driver 76, respectively.

The liquid crystal display device 5001 has a display section 71 which includes a plurality of pixels. The display section 71 corresponds to the display region (not shown) of the active matrix substrate. In the present embodiment, a plurality of pixel circuits 70 are arranged in a matrix in the display section 71. These pixel circuits 70 are connected with one another via source lines SL1 to SLk, gate lines GL1 to GLj, and storage capacitance lines CSL1 to CSLj.

Each of the pixel circuits 70 includes a pixel transistor 10C, a liquid crystal capacitance Clc, and a storage capacitance Cs as shown in FIG. 19(b). The source electrode of the pixel transistor 10C is connected with the source wire S, the gate electrode is connected with the gate wire G, and the drain electrode is connected with a pixel electrode (not shown). The pixel electrode and a common electrode COM form the liquid crystal capacitance Clc. The pixel electrode and the capacitance wire CS form the storage capacitance Cs.

The liquid crystal display device 5001 further includes a source driver 75 electrically connected with the source wire S, a gate driver 76 electrically connected with the gate wire G, a CS driver 77 electrically connected with the capacitance wire CS, and a common electrode driving circuit 74 for driving the common electrode. These driving circuits 75, 76, 77, 74 are connected with a display control circuit 73 for controlling timings and voltages applied to the source wire S, the gate wire G, the capacitance wire CS and the common electrode, and with a power supply circuit (not shown) for supplying electric power to these circuits. The source driver 75, the gate driver 76 and the display control circuit 73 are connected with nonvolatile storage devices 60a, 60b, 60c. The nonvolatile storage devices 60a, 60b, 60c are connected with a common memory control circuit section 61.

The nonvolatile storage devices 60a, 60b, 60c are, for example, the nonvolatile memory array 2001 of the first embodiment. As illustrated in FIG. 19(a), the memory cell has the same configuration as that shown in FIG. 3(a). Alternatively, the memory cell may have, for example, three select transistors connected in parallel as shown in FIG. 3(b).

In the nonvolatile storage device 60a, the configuration information and the unique ID and relevant data of the display panel are stored. These information stored in the nonvolatile storage device 60a are retrieved by the display control circuit 73. Based on these information, the display control circuit 73 carries out switching of the specific display control mode or optimization of control parameters.

The unique ID and relevant data can be inquired from the system side connected with the display panel and are utilized for identification of the display panel and selection of an optimum driving mode. The display control circuit 73 switches a circuit which is to be used for display control based on the information stored in the nonvolatile storage device 60a, thereby realizing the optimum display control for the display.

In the nonvolatile storage device 60b, information about configuration parameters which are necessary for driving of the gate driver, such as redundancy relief information for the gate driver, are stored. Likewise, in the nonvolatile storage device 60c, information about configuration parameters which are necessary for driving of the source driver, such as redundancy relief information for the source driver, are stored.

At least part of the nonvolatile storage devices 60a, 60b, 60c and at least part of circuits 73, 74, 75, 76, 77, 61 provided in the other sections than the display section 71 are monolithically formed in the peripheral region of the active matrix substrate.

In the present embodiment, for example, the gate driver 76 is monolithically formed in the active matrix substrate. The gate driver 76 is made up of, for example, a shift register 410 which has a plurality of stages as shown in FIG. 19(c). In the case where the display section 71 has a pixel matrix of i rows×j columns, the gate driver 76 includes a bistable circuit of i stages so as to correspond to respective rows of the pixel matrix in a one-to-one manner.

The bistable circuit included in the shift register 410 (the structure of one stage of the shift register 410) includes ten thin film transistors MA, MB, MI, MF, MJ, MK, ME, ML, MN and MD and a capacitor CAP1 as shown in FIG. 19(d). This bistable circuit also has an input terminal for receiving the first clock CKA, an input terminal for receiving the second clock CKB, an input terminal for receiving the third clock CKC, an input terminal for receiving the fourth clock CKD, an input terminal for receiving set signal S, an input terminal for receiving reset signal R, an input terminal for receiving clear signal CLR, and an output terminal for outputting state signal Q.

Note that detailed circuit configurations of the display control circuit 73, the common electrode driving circuit 74, the source driver 75 and the CS driver 77 are generally equal to the configurations of known liquid crystal display devices, and thus, detailed description thereof is omitted herein.

(Seventh Embodiment)

Figure 20:
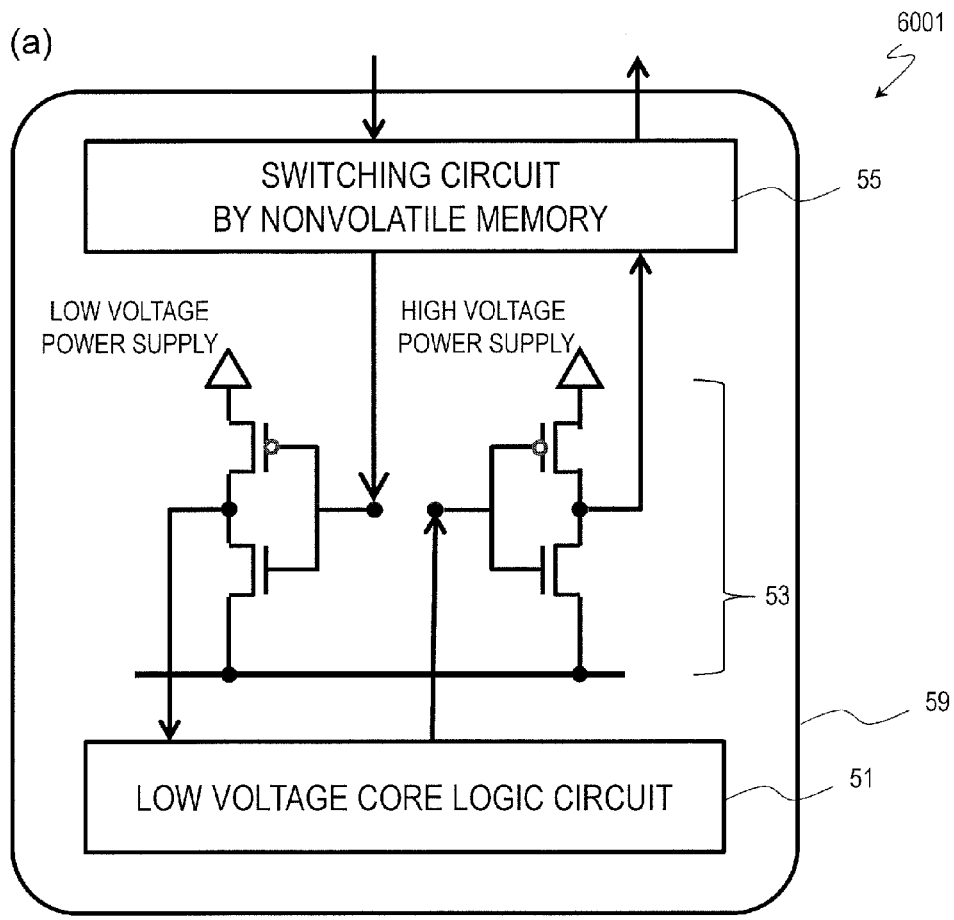
[FIGS. 20] (a) and (b) are a circuit block diagram illustrating an integrated circuit 6001 of the seventh embodiment and a cross-sectional view showing part of the semiconductor device.
Figure 20:
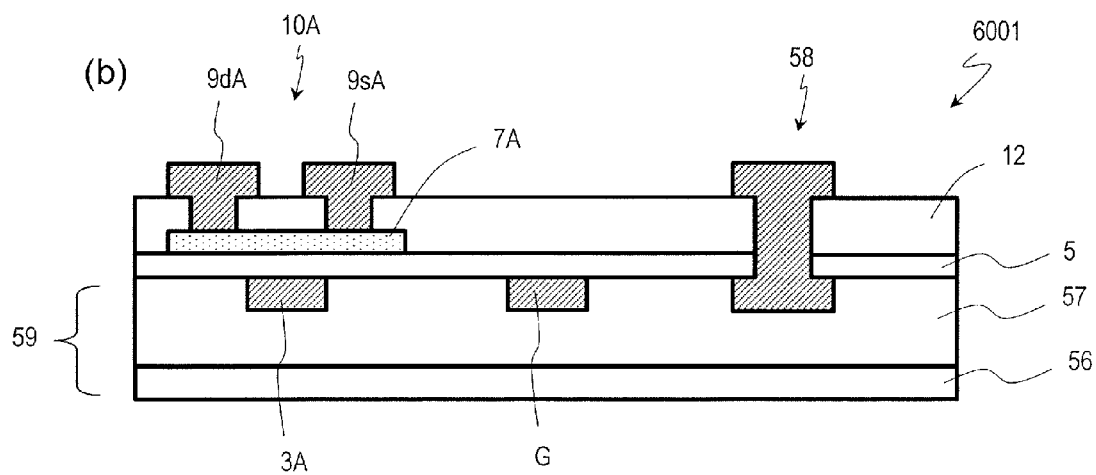

An example of a semiconductor device in which the present invention is applied to an integrated circuit such as VLSI is described with reference to FIG. 20.

FIGS. 20(a) and 20(b) are a circuit block diagram illustrating a semiconductor device (integrated circuit) 6001 of the present embodiment and a cross-sectional view showing part of the semiconductor device.

The integrated circuit (VLSI) 6001 of the present embodiment includes a low voltage core logic circuit 51, a voltage converter circuit and buffer circuit 53, and a switching circuit 55 by a nonvolatile memory. These circuits 51, 53, 55 are supported on a LSI chip 59. The switching circuit 55 utilizes the nonvolatile memory device for switching wires. Thus, it is possible to realize switching of circuits, switching of functions, or change of circuit block configurations. The switching circuit 55 may be connected with, for example, a high voltage circuit provided outside the LSI chip 59 or an interface provided between chips.

In the present embodiment, the switching circuit 55 includes the memory cell 101 as the nonvolatile memory device.

As shown in FIG. 20(b), the LSI chip 59 includes an LSI element layer 56 and an interlayer insulating layer 57 covering the LSI element layer 56. The low voltage core logic circuit 51 is provided inside, for example. The voltage converter circuit and buffer circuit 53 and the switching circuit 55 are provided on the interlayer insulating layer 57. Note that FIG. 20(b) only shows the structures of the memory transistor 10A of the switching circuit 55, the wire section, and the contact portion 58. The select transistor 10B is also provided on the interlayer insulating layer 57. The select transistor 10B has the same transistor structure as the memory transistor 10A although the channel length and the channel width are different.

The semiconductor device of the present embodiment is not limited to a display device or an integrated circuit. For example, the memory transistor 10A and the select transistor 10B can be manufactured at a relatively low temperature (for example, 200° C. or lower) and are therefore applicable to IC tags and the like. In this case, the memory transistor 10A can be utilized for memorization of ID. Further, since a transparent metal oxide film can be used as the oxide semiconductor film, the semiconductor device of the present embodiment can also be used in mass storage devices for digital signage. The semiconductor device of the present embodiment is applicable not only to storage devices but also to programmable logic circuit devices, such as ASIC (Application Specific Integrated Circuit) and FPGA (Field-Programmable Gate Array).

(Other Embodiments)

Configuration examples of the memory transistor 10A other than that shown in FIG. 2 are described with reference to FIG. 21 to FIG. 24.

To further increase drain current Ids during a writing operation of the memory transistor 10A, another gate electrode 18 may be provided on the opposite side to the gate electrode 3A in the active layer 7A.

Figure 21:
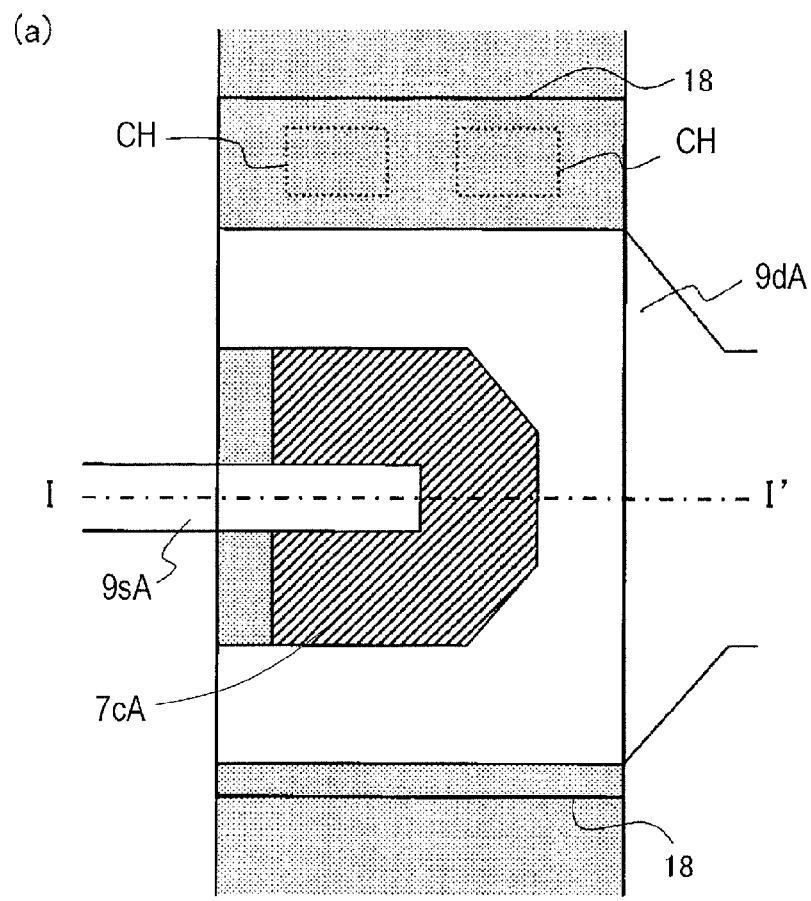
[FIGS. 21] (a) and (b) are a plan view and cross-sectional view illustrating a configuration of the memory transistor 10A which has an upper gate electrode above an active layer.
Figure 21:
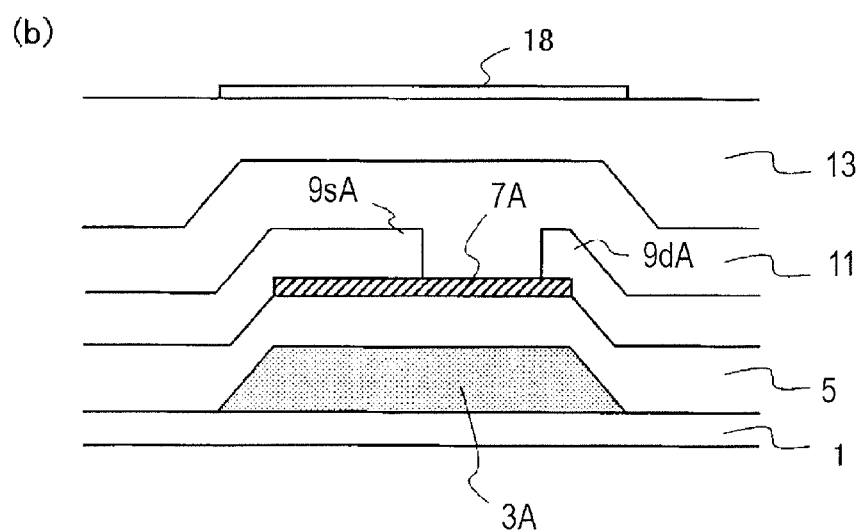

FIGS. 21(a) and 21(b) are a plan view and cross-sectional view illustrating a configuration of the memory transistor 10A which has an upper gate electrode above an active layer. In FIG. 21, elements which are equivalent to those of FIG. 2 are designated by the same reference numerals, and descriptions thereof are herein omitted. Note that the select transistor 10B has the same transistor structure as that of the illustrated memory transistor 10A although the channel length and the channel width are different.

In this example, an upper gate electrode 18 is provided above the active layer 7A with interlayer insulating layers (here, the passivation film 11 and the organic insulating film 13) interposed therebetween. The upper gate electrode 18 is arranges so as to extend over at least the channel region 7cA of the active layer 7A when viewed in a direction normal to the substrate 1. The upper gate electrode 18 may be a transparent electrode formed from a transparent electrically-conductive film which is common among the transparent electrode and the pixel electrode, for example. The upper gate electrode 18 may be connected to the gate electrode (gate wire) 3A, which is on the substrate 1 side of the active layer 7A, via a contact hole CH. Due to this arrangement, the another gate electrode 18 and the gate electrode 3A are at the same potential, and therefore, drain current Ids can be further increased due to the backgate effect. In the example shown in FIG. 21(a), the upper gate electrode 18 is shown as a transparent electrode, although it does not need to be a transparent electrode. Providing the upper gate electrode 18 in the memory transistor 10A in this way enables to increase the Joule heat and shorten the writing duration without greatly increasing gate voltage Vgs. Note that the upper gate electrode 18 may not be provided in the select transistor 10B while the upper gate electrode 18 is provided in the memory transistor 10A. In this case, the difference in writing speed between the memory transistor 10A and the select transistor 10B can be further increased.

Next, a configuration which has a protection layer as the etch stop above the active layer of the memory transistor 10A is described.

Figure 22:
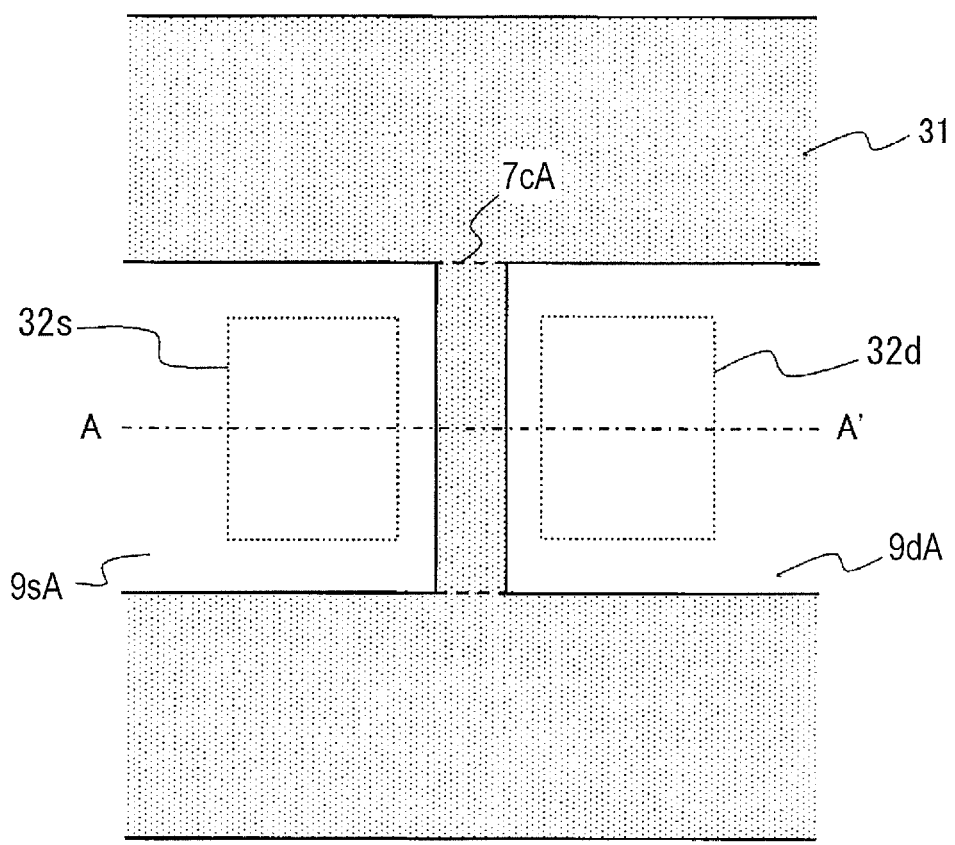
[FIGS. 22] (a) and (b) are a plan view and cross-sectional view illustrating an example of the configuration which has a protection layer as the etch stop on an active layer of the memory transistor 10A.
Figure 22:
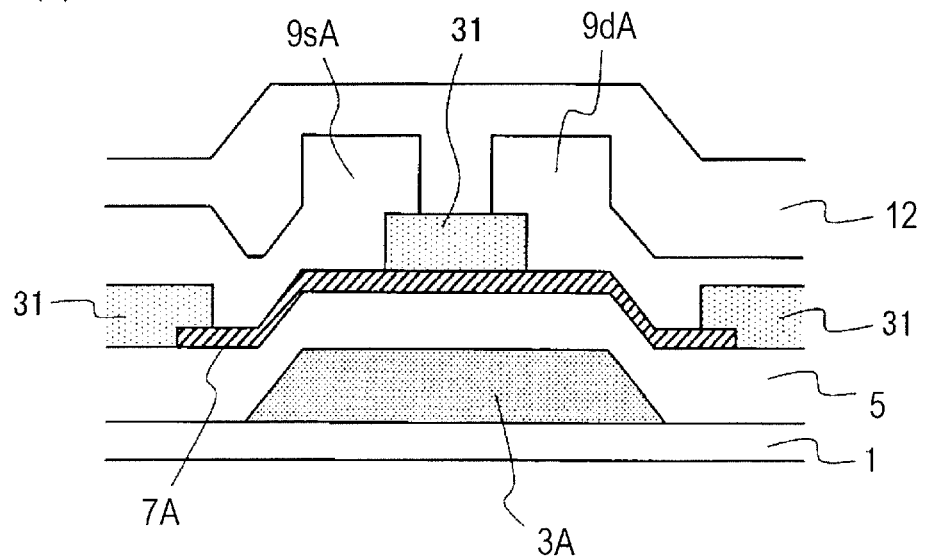

FIGS. 22(a) and 22(b) are a plan view and cross-sectional view showing an example of the configuration which has a protection layer as the etch stop above the active layer of the memory transistor 10A. The cross section shown in FIG. 22(b) is a cross section taken along line A-A' of FIG. 22(a). In FIG. 22, elements which are equivalent to those of FIG. 2 are designated by the same reference numerals, and descriptions thereof are herein omitted. Note that, although not shown, the select transistor 10B has the same transistor structure as that of the illustrated memory transistor 10A although the channel length and the channel width are different.

The memory transistor 10A includes a protection layer 31 at least over the channel region 7cA of the active layer 7A. The width in the channel direction of the active layer 7A is greater than the width in the channel direction of the gate electrode 3A. In this example, the protection layer 31 is arranged so as to cover the active layer 7A. The protection layer 31 has openings 32s, 32d through which parts of the active layer 7A on both sides of the channel region 7cA are exposed. The source electrode 9sA and the drain electrode 9dA are provided on the protection layer 31 and in the openings 32s, 32d and are in contact with the active layer 7A in the openings 32s, 32d. As a result, a region of the active layer 7A which is in contact with the source electrode 9sA forms a source contact region, and a region of the active layer 7A which is in contact with the drain electrode 9dA forms a drain contact region.

Although in FIG. 22 the planar shape of the channel region 7cA is rectangular, it may be a U-shape such as shown in FIG. 2(b).

Next, a configuration in which the active layer is provided on the source and drain electrodes of the memory transistor 10A is described.

Figure 23:
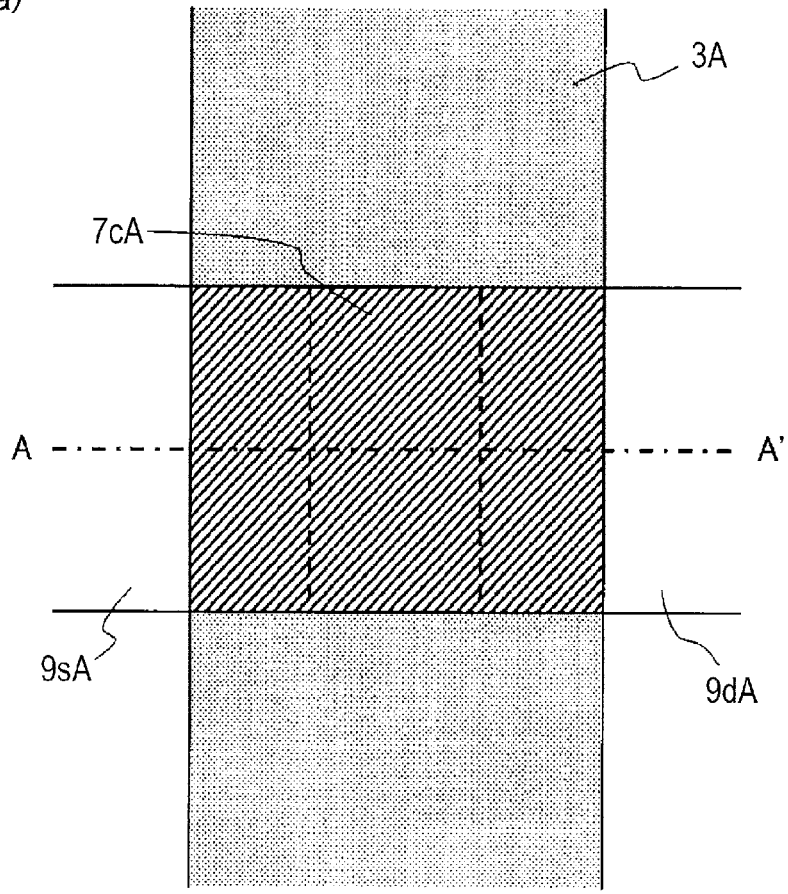
[FIGS. 23] (a) and (b) are a plan view and cross-sectional view illustrating an example of the configuration which has an active layer on the source and drain electrodes of the memory transistor 10A.
Figure 23:
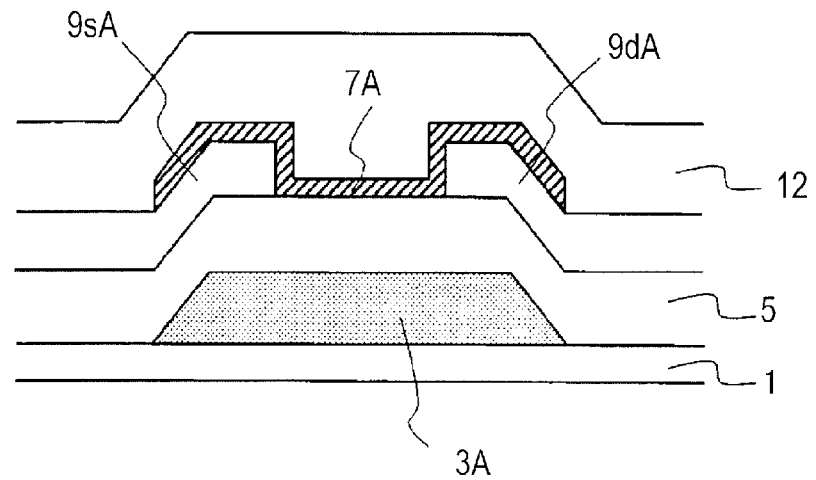

FIGS. 23(a) and 23(b) are a plan view and cross-sectional view showing an example of the configuration in which the active layer is provided on the source and drain electrodes of the memory transistor 10A. The cross section shown in FIG. 23(b) is a cross section taken along line A-A' of FIG. 23(a). In FIG. 23, elements which are equivalent to those of FIG. 2 are designated by the same reference numerals, and descriptions thereof are herein omitted. Note that the select transistor 10B has the same transistor structure as that of the illustrated memory transistor 10A although the channel length and the channel width are different.

In the memory transistor 10A, a source electrode 9sA and a drain electrode 9dA are provided on a gate insulating film 5 that covers a gate electrode 3A such that the source electrode 9sA and the drain electrode 9dA are spaced away from each other. On the source electrode 9sA and the drain electrode 9dA, an active layer 7A is provided. The active layer 7A is arranged so as to be in contact with the gate insulating film 5 which is present between the source electrode 9sA and the drain electrode 9dA and with the upper surfaces and lateral surfaces of the source electrode 9sA and the drain electrode 9dA. Part of the active layer 7A which extends over the gate electrode 3A and which is present between a region that is in contact with the lateral surface of the source electrode 9sA and a region that is in contact with the lateral surface of the drain electrode 9dA forms a channel region 7cA.

Although in FIG. 23 the planar shape of the channel region 7cA is rectangular, it may be a U-shape such as shown in FIG. 2(b).

Although in the previously-described embodiments bottom gate type thin film transistors are used as the memory transistor 10A and the select transistor 10B, they may be top gate type thin film transistors.

Figure 24:
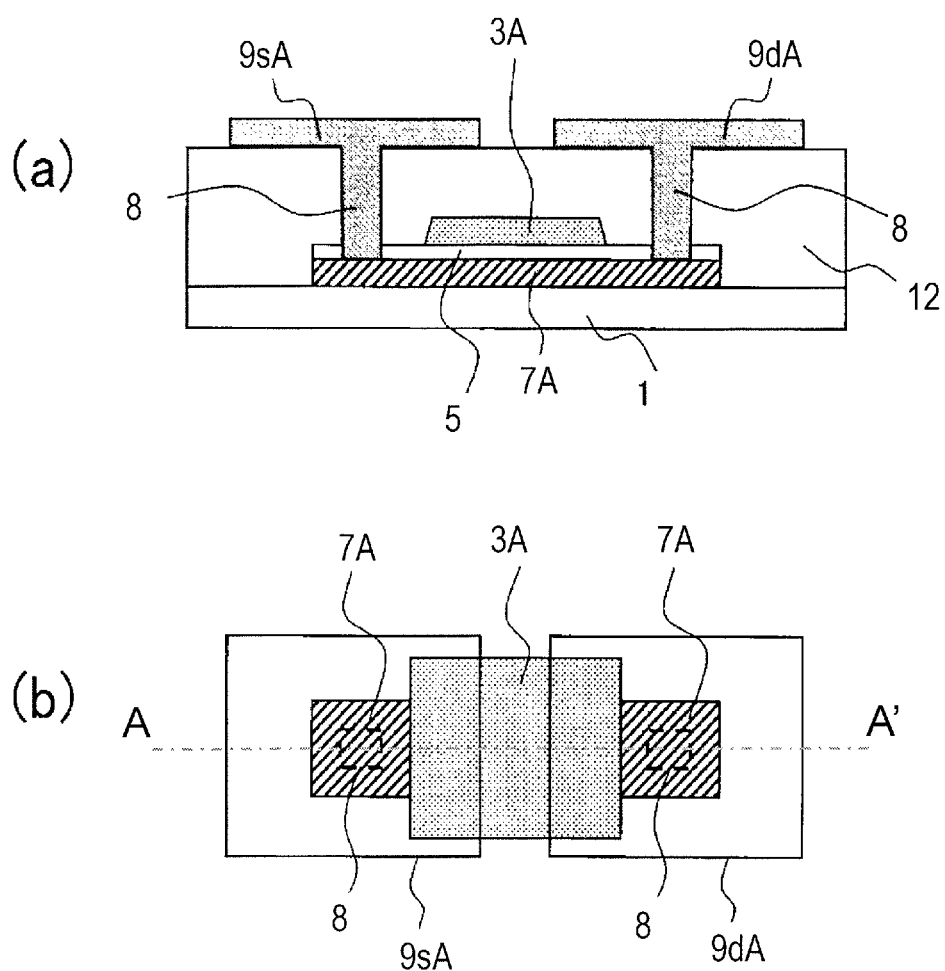
[FIGS. 24] (a) and (b) are a cross-sectional view and plan view illustrating an example of the memory transistor 10A which has a top gate structure.

FIGS. 24(a) and 24(b) are a plan view and cross-sectional view illustrating an example of the memory transistor 10A which has a top gate structure. The cross section shown in FIG. 24(b) is a cross section taken along line A-A' of FIG. 24(a). In FIG. 24, elements which are equivalent to those of FIG. 2 are designated by the same reference numerals.

The memory transistor 10A includes, on the substrate 1, an active layer 7A which includes a metal oxide semiconductor, a gate insulating film 5 which covers the active layer 7A, and a gate electrode 3A provided on the gate insulating film 5. Over these components, an interlayer insulating layer 12 is provided, and a source electrode 9sA and a drain electrode 9dA are provided on the interlayer insulating layer 12. These are in contact with the active layer 7A in contact holes 8 formed in the interlayer insulating layer 12. Although not shown, the select transistor 10B may also have the same transistor structure.

The select transistor 10B may have a configuration which includes two or more channel regions connected in series or parallel. In such a case, for example, the same effects as those of the previously-described embodiments are achieved so long as channel length L1 of the memory transistor 10A is smaller than the smallest value of the channel lengths of the plurality of channel regions of the select transistor 10B. Alternatively, the select transistor 10B that has the above-described configuration is approximated to a transistor which provides performance equivalent to that of that transistor and which has a single channel region, and the channel length and the channel width of the approximate transistor may be "channel length L2" and "channel width W2". As an example, the same effects as those of the previously-described embodiments are achieved when channel width W1 of the memory transistor 10A is greater than the channel width of the transistor approximated to the select transistor 10B. Note that the "approximate transistor" which provides equivalent performance can be appropriately obtained from known relationships. For example, when the select transistor 10B has a channel region a and a channel region b which are connected in parallel, where the channel lengths of the channel region a and the channel region b are "channel length La" and "channel length Lb" and the channel widths are "channel width Wa" and "channel width Wb" and the channel length and the channel width of the "approximate transistor" which provides performance equivalent to that of this composite transistor are L1' and W1', L1' and W1' can be set such that W1'/L1'=Wa/La+Wb/Lb holds true.

Further, the channel regions of the memory transistor 10A and the select transistor 10B may have a shape whose length in the channel length direction or channel width direction is nonuniform when viewed in a direction normal to the substrate. When the length in the channel length direction is nonuniform, the smallest value of the lengths in the channel length direction may be "channel length L1, L2". As an example, the same effects as those of the previously-described embodiments are achieved when the smallest value of the lengths in the channel length direction of the memory transistor 10A is smaller than the smallest value of the lengths in the channel length direction of the select transistor 10B. Alternatively, the transistors 10A, 10B that have the above-described nonuniform shape are approximated to a transistor which provides performance equivalent to that of that transistor and whose channel length and channel width are constant, and the channel length and the channel width of the approximate transistor may be "channel length L1, L2" and "channel width W1, W2".

Thus, the present invention is also applicable to a case where the memory transistor 10A and the select transistor 10B has a configuration which is difficult to determine the channel length and the channel width. In such a case, as illustrated above, for example, the same effects as those of the previously-described embodiments are achieved so long as the smallest value of the lengths in the channel length direction and the channel length and channel width of the approximate transistor are set so as to meet the same relationships as those of the previously-described embodiments.

In the semiconductor device of the present embodiment, a writing operation in the memory transistor 10A is realized by Joule heat produced in the oxide semiconductor layer 7A. The temperature of the channel region 7cA during the writing operation is, for example, not less than 200° C. There is a probability that the temperature is still higher on the drain side of the channel region 7cA (for example, not less than 250° C., or not less than 300° C.). Therefore, it is preferred that a layer of a low heat resistance material (softening temperature: less than 200° C., preferably less than 300° C.), for example, an organic insulating film, is not provided above the oxide semiconductor layer 7A of the memory transistor 10A.

In the configuration illustrated in FIG. 21, the oxide semiconductor layer 7A of the memory transistor 10A is covered with the passivation film 11 and the organic insulating film 13. If this organic insulating film 13 has low heat resistance, there is a probability that, in some writing conditions, part of the organic insulating film 13 lying above the oxide semiconductor layer 7A peels off from the passivation film 11 or deforms. Particularly, peeling or deformation can occur on an edge of the organic insulating film 13 on the drain side of the oxide semiconductor layer 7A. If peeling or deformation of the organic insulating film 13 occurs, for example, in the case where a memory array is formed using a plurality of memory transistors 10A, there is a probability that a written memory transistor 10A and an unwritten memory transistor 10A are distinguished by the position of peeling or deformation of the organic insulating film 13.

In view of such, an inorganic insulating film of relatively high heat resistance (the silicon oxide film listed above or the like) may be provided as the passivation film 11 above the oxide semiconductor layer 7A, and the organic insulating film 13 may not be provided on the passivation film 11. Due to this arrangement, the above-described problem which is attributed to the heat produced during writing would not arise, and therefore, the reliability and security of the device can be improved.

An organic insulating film may not be used as the flattening film. Alternatively, the organic insulating film 13 may be provided only in part of the substrate 1. In this case, it is only necessary that the organic insulating film 13 is not provided at least above the oxide semiconductor layer 7A of the memory transistor 10A. For example, the organic insulating film 13 may be provided above the oxide semiconductor layer 7B of the select transistor 10B.

Note that, in the configuration illustrated in FIG. 21, the above-described problem which is attributed to the heat produced during writing can be suppressed even when a flattening film of a high heat resistance material (for example, softening temperature: not less than 200° C., preferably not less than 300° C.) is used instead of the organic insulating film 13. For example, an inorganic insulating film, such as an inorganic SOG (spin on glass) film, may be used as the flattening film.

Although in each of the above-described embodiments the memory transistor 10A and the select transistor 10B are thin film transistors, they may be MOS type transistors. Even in MOS type transistors, transition to the resistor state can be realized by allowing a drain current of a high current density to flow through the channel region. The MOS type transistor has a configuration where, for example, a metal oxide semiconductor film is provided on a silicon substrate with an insulating film interposed therebetween. In such a configuration, a silicon substrate of high heat radiation is used, but the silicon substrate and the oxide semiconductor film are separated by the insulating film, and therefore, transfer of the Joule heat produced by the write current to the silicon substrate can be suppressed. Thus, the resistance of the oxide semiconductor film can be reduced by the Joule heat.

The conductivity type of the memory transistor 10A and the select transistor 10B is not limited to the n-channel type but may be the p-channel type. The material, configuration, thickness, transistor characteristics, and writing characteristics of the electrically-conductive films and insulating films which are constituents of the memory transistor 10A and the select transistor 10B are not limited to those described in the above-described embodiments.

INDUSTRIAL APPLICABILITY

A semiconductor device of the present invention is applicable to a wide variety of semiconductor devices and electronic devices which include memory cells. For example, it is applicable to nonvolatile semiconductor storage devices, integrated circuits (IC, LSI), various display devices, such as liquid crystal display devices and organic EL display devices, and active matrix substrates for use in various display devices.

REFERENCE SIGNS LIST

1: substrate
3A, 3B: gate electrode
3sg: gate connecting portion
5: gate insulating film
7A, 7B: active layer
7cA, 7cB: channel region
9dA, 9bB: drain electrode
9sA, 9sB: source electrode
9cs: capacitance electrode
9sg: source connecting portion
10A: memory transistor
10B, 10B_1, 10B_2, 10B_3: select transistor
10C: pixel transistor
11: protection film (passivation film)
13: organic insulating film
15: contact hole
17: upper electrically-conductive layer
18: upper gate electrode
19: pixel electrode
20: capacitance portion
30: source contact portion
31: protection layer
32s, 32d, 33, 34: opening
40: source intersection
101: memory cell
102: bit line voltage control circuit
103: bit line decoder
104: word line decoder
105: writing voltage control circuit
106: sense amplifier circuit
200: logic circuit
300: memory element
301: first select transistor
302: second select transistor
303: gate control line
1001, 2001, 3001, 4001: nonvolatile memory array
5001: liquid crystal display device
6001: integrated circuit
CS: capacitance wire
G: gate wire
S: source wire

The invention claimed is:

1. A semiconductor device comprising at least one memory cell, the at least one memory cell including
a memory transistor having a first channel length L1 and a first channel width W1, and
a plurality of select transistors, each of the plurality of select transistors electrically being connected in series with the memory transistor and independently having a second channel length L2 and a second channel width W2,
wherein each of the memory transistor and the plurality of selection transistors includes an active layer formed from a common oxide semiconductor film,
the memory transistor is a transistor which is capable of being irreversibly changed from a semiconductor state where a drain current Ids depends on a gate voltage Vg to a resistor state where the drain current Ids does not depend on the gate voltage Vg, and
the second channel length L2 is greater than the first channel length L1.

2. The semiconductor device of claim 1, wherein the plurality of select transistors are electrically connected in parallel with each other and share an identical gate control line.

3. The semiconductor device of claim 2, wherein the second channel width W2 is smaller than the first channel width W1.

4. The semiconductor device of claim 2, wherein a ratio W2/L2 of the second channel width W2 to the second channel length L2 in the plurality of select transistors is smaller than a ratio W1/L1 of the first channel width W1 to the first channel length L1 in the memory transistor.

5. The semiconductor device of claim 2, wherein a sum of the second channel widths W2 of the plurality of select transistors is greater than the first channel width W1 of the memory transistor.

6. The semiconductor device of claim 1, wherein
the memory transistor is supported by a substrate,
the memory transistor includes
a gate electrode,
a gate insulating film covering the gate electrode,
the active layer provided on the gate insulating film,
a source electrode provided on the active layer so as to be in contact with a part of the active layer, and a drain electrode provided on the active layer so as to be in contact with another part of the active layer, and when viewed in a direction normal to the substrate, a portion of the active layer which extends over the gate electrode with the gate insulating film interposed therebetween and which is located between the source electrode and the drain electrode has a U-shape.

7. The semiconductor device of claim 1, wherein the oxide semiconductor film is an In—Ga—Zn—O based semiconductor film.

8. The semiconductor device of claim 7, wherein the In—Ga—Zn—O based semiconductor film includes a crystalline portion.

9. The semiconductor device of claim 1, wherein the memory transistor and the plurality of select transistors are thin film transistors.

10. The semiconductor device of claim 1, wherein the memory transistor is either of a memory transistor S which is in the semiconductor state or a memory transistor R which is in the resistor state.

11. The semiconductor device of claim 10, wherein
the at least one memory cell is a plurality of memory cells,
in some of the plurality of memory cells, the memory transistor is the memory transistor S, and
in other ones of the plurality of memory cells, the memory transistor is the memory transistor R.

12. The semiconductor device of claim 10, wherein
in the memory transistor S, while an absolute value of a drain-source voltage is in a range of not less than 0.1 V and not more than 10 V, there is a voltage range for the gate-source voltage in which an absolute value of the drain current Ids divided by the channel width W1, Ids/W1, is not more than $1 \times 10^{-14}$ A/μm, and
in the memory transistor R, even when the gate-source voltage is set within the voltage range while the absolute value of the drain-source voltage is in a range of not less than 0.1 V and not more than 10 V, the absolute value of the drain current Ids divided by the channel width W1, Ids/W1, varies depending on the drain-source voltage so as to be not less than $1 \times 10^{-11}$ A/μm.

13. The semiconductor device of claim 10, wherein
the at least one memory cell is a single memory cell and includes the memory transistor S,
an internal node is formed by connection of the memory transistor S and the plurality of select transistors, and
while the memory transistor S is in an ON state, a low-level voltage VL is output from the internal node when a gate voltage of the plurality of select transistors is a high-level voltage VH, and a high-level voltage VH is output from the internal node when the gate voltage of the plurality of select transistors is a low-level voltage VL.

14. The semiconductor device of claim 10, wherein
the at least one memory cell is a single memory cell and includes either of the memory transistor S or the memory transistor R,
an internal node is formed by connection of either of the memory transistor S or the memory transistor R and the plurality of select transistors,
when the at least one memory cell includes the memory transistor S, a gate voltage of the memory transistor S is set to a low-level voltage VL that prevents the memory transistor S from transitioning to an ON state, and a gate voltage of the plurality of select transistors is set to a high-level voltage VH, a low-level voltage VL is output from the internal node, and when the at least one memory cell includes the memory transistor R, a gate voltage of the memory transistor R is set to a low-level voltage VL that prevents the memory transistor R from transitioning to an ON state, and a gate voltage of the plurality of select transistors is set to a high-level voltage VH, a high-level voltage VH is output from the internal node.

15. The semiconductor device of claim 11, further comprising:
a word line control circuit which controls a plurality of first word lines and a plurality of second word lines;
a bit line control circuit which controls a plurality of bit lines; and
a sense amplifier circuit which detects a reading signal from the plurality of memory cells,
wherein the plurality of memory cells are arranged in a row direction and a column direction,
gate electrodes of the memory transistors included in memory cells arranged in the same row are connected with the word line control circuit via one of the plurality of first word lines corresponding to that row,
a gate electrode of each of the plurality of select transistors included in memory cells arranged in the same row is connected with the word line control circuit via one of the plurality of second word lines corresponding to that row, and
drain electrodes of the memory transistors included in memory cells arranged in the same column are connected with the bit line control circuit and the sense amplifier circuit via one of the plurality of bit lines corresponding to that column.

16. The semiconductor device of claim 11, further comprising:
a word line control circuit which controls first and second word lines;
a bit line control circuit which controls a plurality of bit lines; and
a sense amplifier circuit which detects a reading signal from the plurality of memory cells,
wherein the plurality of memory cells are arranged in a row direction,
gate electrodes of the memory transistors included in the plurality of memory cells are connected with the word line control circuit via the first word line,
a gate electrode of each of the plurality of select transistors included in the plurality of memory cells is connected with the word line control circuit via the second word line, and
a drain electrode of the memory transistor included in memory cells arranged in each column is connected with the bit line control circuit and the sense amplifier circuit via one of the plurality of bit lines corresponding to that column.

17. The semiconductor device of claim 11, further comprising:
a word line control circuit which controls a first word line and a plurality of second word lines;
a bit line control circuit which controls a bit line; and
a sense amplifier circuit which detects a reading signal from the plurality of memory cells,
wherein the plurality of memory cells are arranged in a column direction,
a gate electrode of the memory transistor included in memory cells arranged in each row is connected with the word line control circuit via the first word line,
a gate electrode of each of the plurality of select transistors included in memory cells arranged in each row is connected with the word line control circuit via one of the plurality of second word lines corresponding to that row, and drain electrodes of the memory transistors included in the plurality of memory cells are connected with the bit line control circuit and the sense amplifier circuit via the bit line.

18. The semiconductor device of claim 11, further comprising a sense amplifier circuit which detects a reading signal from the plurality of memory cells, wherein the plurality of memory cells are arranged in a row direction and/or a column direction, an internal node is formed by connection of the memory transistor and the plurality of select transistors, and the internal node is connected with the sense amplifier circuit.

19. The semiconductor device of claim 15, wherein a gate-source voltage in each of the plurality of select transistors is not less than a gate-source voltage in the memory transistor.

20. The semiconductor device of claim 15, wherein a threshold voltage of each of the plurality of select transistors is not less than a threshold voltage of the memory transistor.

* * * * *